(12) United States Patent
Jun et al.

(10) Patent No.: US 11,616,016 B2
(45) Date of Patent: Mar. 28, 2023

(54) SEMICONDUCTOR DEVICES AND METHOD OF MANUFACTURING THE SAME

(71) Applicant: SAMSUNG ELECTRONICS CO., LTD., Suwon-si (KR)

(72) Inventors: Hwi-Chan Jun, Yongin-si (KR); Seul-Ki Hong, Seoul (KR); Hyun-Soo Kim, Hwaseong-si (KR); Sang-Hyun Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 55 days.

(21) Appl. No.: 17/235,425

(22) Filed: Apr. 20, 2021

(65) Prior Publication Data

US 2021/0242126 A1    Aug. 5, 2021

Related U.S. Application Data

(63) Continuation of application No. 16/229,781, filed on Dec. 21, 2018, now Pat. No. 11,004,788.

(30) Foreign Application Priority Data

Jun. 4, 2018  (KR) .......................... 10-2018-0064024

(51) Int. Cl.
*H01L 23/528*     (2006.01)
*H01L 29/423*     (2006.01)
(Continued)

(52) U.S. Cl.
CPC ........ *H01L 23/528* (2013.01); *H01L 27/0886* (2013.01); *H01L 29/41791* (2013.01); *H01L 29/4232* (2013.01)

(58) Field of Classification Search
CPC ............... H01L 23/528; H01L 27/0886; H01L 27/10882; H01L 27/10885; H01L 27/1088; H01L 29/41791; H01L 29/4232
See application file for complete search history.

(56) References Cited

U.S. PATENT DOCUMENTS 6,287,951 B1    9/2001  Lucas et al.
8,716,124 B2    5/2014  Schultz
(Continued)

FOREIGN PATENT DOCUMENTS

KR    10-2017-0030137    3/2017

OTHER PUBLICATIONS

Office Action dated Dec. 14, 2022 in corresponding Korean Patent Application No. 10-2018-0064024, in Korean, 5 pages.

*Primary Examiner* — Brook Kebede
(74) *Attorney, Agent, or Firm* — F. Chau & Associates, LLC

(57) ABSTRACT

A semiconductor device may include a plurality of active patterns and a plurality of gate structure on a substrate, a first insulating interlayer covering the active patterns and the gate structures, a plurality of first contact plugs extending through the first insulating interlayer, a plurality of second contact plugs extending through the first insulating interlayer, and a first connecting pattern directly contacting a sidewall of at least one contact plug selected from the first and second contact plugs. Each of gate structures may include a gate insulation layer, a gate electrode and a capping pattern. Each of first contact plugs may contact the active patterns adjacent to the gate structure. Each of the second contact plugs may contact the gate electrode in the gate structures. An upper surface of the first connecting pattern may be substantially coplanar with upper surfaces of the first and second contact plugs.

20 Claims, 34 Drawing Sheets

(51) Int. Cl.
*H01L 29/417* (2006.01)
*H01L 27/088* (2006.01)

(56) References Cited

U.S. PATENT DOCUMENTS

| | | |
|---|---|---|
| 9,105,614 B2 | 8/2015 | Sardesai |
| 9,515,148 B2 | 12/2016 | Li et al. |
| 9,799,567 B2 | 10/2017 | Kuo et al. |
| 9,853,008 B2 | 12/2017 | Tseng et al. |
| 10,192,823 B2 | 1/2019 | Yoon et al. |
| 2004/0183101 A1* | 9/2004 | Lee ................ H01L 21/76897 438/129 |
| 2005/0167718 A1* | 8/2005 | Ema .................. H01L 23/5223 257/E21.582 |
| 2015/0380305 A1 | 12/2015 | Basker et al. |
| 2016/0020148 A1 | 1/2016 | Song et al. |
| 2016/0260669 A1 | 9/2016 | Paak et al. |
| 2016/0308008 A1 | 10/2016 | Yeo et al. |
| 2019/0371724 A1 | 12/2019 | Jun et al. |

\* cited by examiner

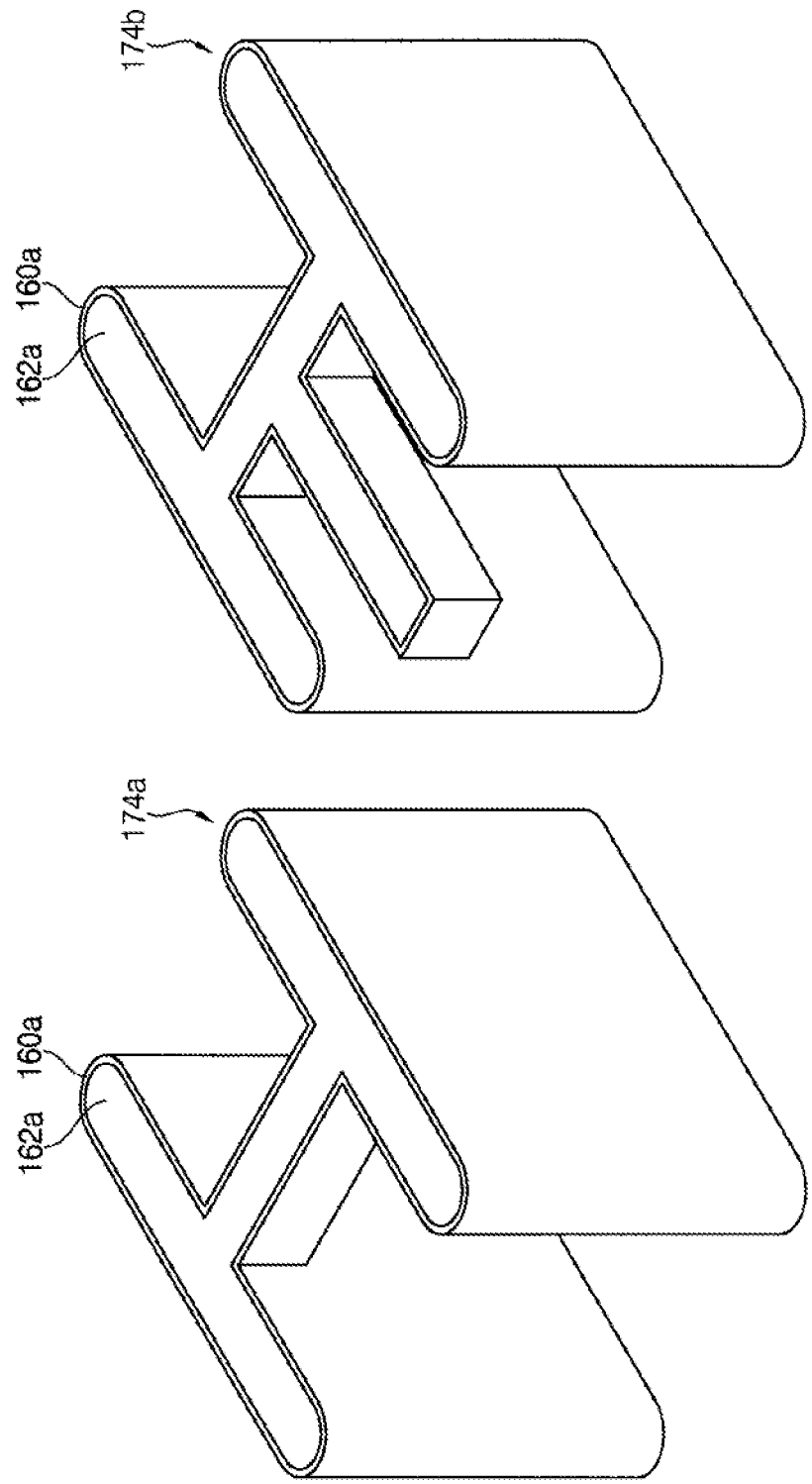

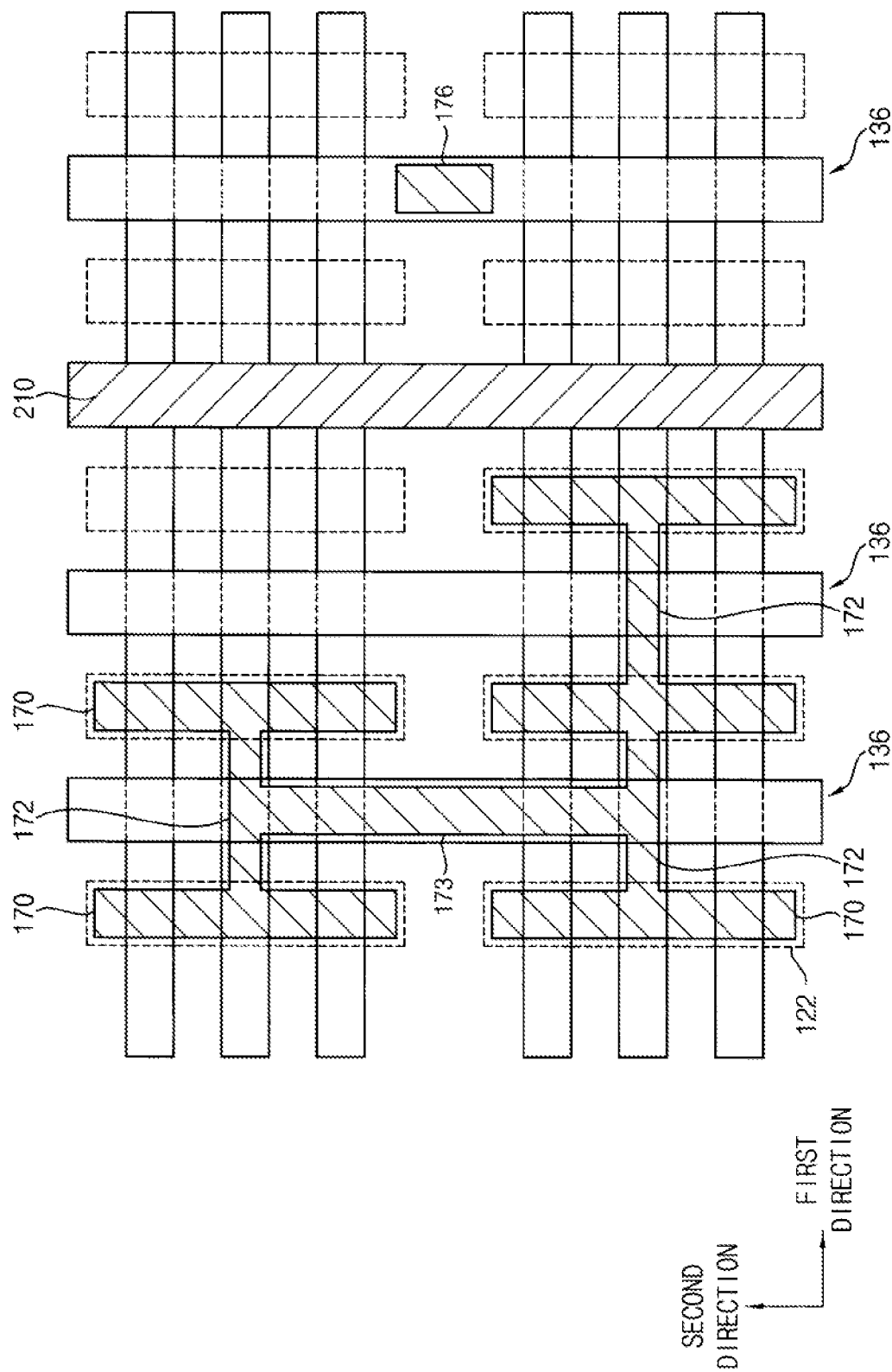

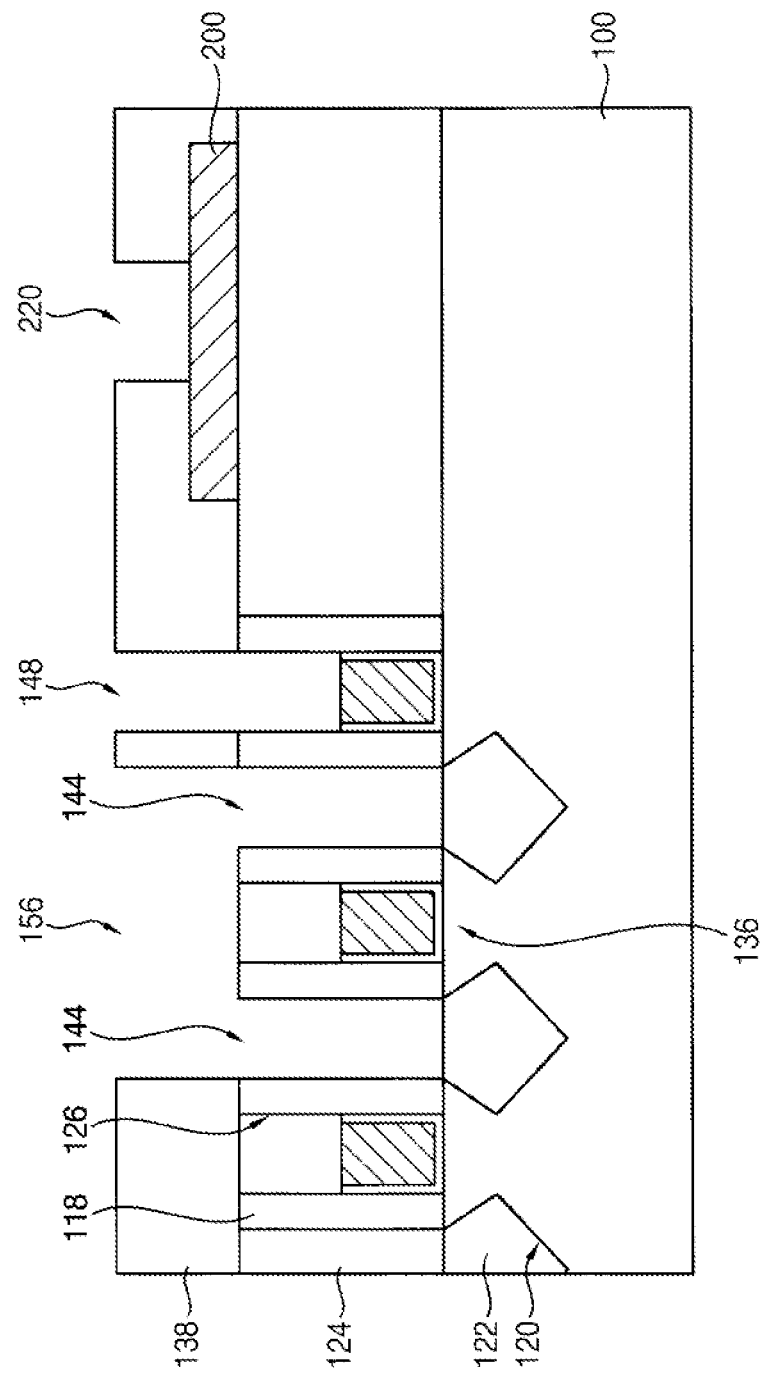

SEMICONDUCTOR DEVICES AND METHOD OF MANUFACTURING THE SAME

CROSS-REFERENCE TO RELATED APPLICATION

This application claims priority under 35 USC § 119 to U.S. patent application Ser. No. 16/229,781 filed on Dec. 21, 2018 and Korean Patent Application No. 10-2018-0064024, filed on Jun. 4, 2018 in the Korean Intellectual Property Office (KIPO), the contents of which are herein incorporated by reference in their entirety.

BACKGROUND

1. Field

Example embodiments relate to semiconductor devices and methods of manufacturing the same. More particularly, example embodiments relate to semiconductor devices including wirings and methods of manufacturing the same.

2. Description of the Related Art

A semiconductor device includes transistors and wirings. The wirings may include contact plugs contacting gates and/or active regions of the transistors, and a connecting pattern connected to the contact plugs to each other.

A fin field effect transistor (FinFET) may be a component of a semiconductor device that may include one or more first contact plugs contacting an active region, one or more second contact plugs contacting a gate electrode, and a connecting pattern electrically connected to at least one contact plug selected from the first and second contact plugs. In some cases, a contact failure may occur at an interface between the first or second contact plug and the connecting pattern.

SUMMARY

Example embodiments provide a semiconductor device including contact plugs and connecting patterns.

According to example embodiments, there is provided a semiconductor device. The semiconductor device may include a plurality of active patterns on a substrate, a plurality of gate structure on the substrate, a first insulating interlayer covering at least a portion of the active patterns and the gate structures, a plurality of first contact plugs extending through the first insulating interlayer, a plurality of second contact plugs extending through the first insulating interlayer, and a first connecting pattern directly contacting a sidewall of at least one contact plug selected from the first and second contact plugs. Each of gate structures may include a gate insulation layer, a gate electrode and a capping pattern. Each of first contact plugs may contact the active patterns adjacent to the gate structure. Each of the second contact plugs may contact the gate electrode in the gate structures. An upper surface of the first connecting pattern may be substantially coplanar with upper surfaces of the first and second contact plugs.

According to example embodiments, there is provided a semiconductor device. The semiconductor device may include an active fin protruding from a substrate, a plurality of gate structure on the active fin, an epitaxial structure on the active fin between the gate structures, a first insulating interlayer covering at least a portion of the gate structures, the active patterns and the epitaxial structure, a plurality of first contact plugs extending through the first insulating interlayer, a plurality of second contact plugs extending through the first insulating interlayer and a first connecting pattern directly contacting a sidewall of at least one contact plug selected from the first and second contact plugs. The active fin may extend in a first direction. Each of gate structures may extend in a second direction crossing the first direction, and may include a gate insulation layer, a gate electrode and a capping pattern. Each of the first contact plugs may contact the epitaxial structure. Each of the second contact plugs may the gate electrode in the gate structures. An upper surface of the first connecting pattern may be substantially coplanar with upper surfaces of the first and second contact plugs.

According to example embodiments, there is provided a semiconductor device. The semiconductor device may include a substrate including first contact regions and second contact regions, an insulating interlayer on the substrate, a plurality of first contact plugs extending from an upper surface the insulating interlayer to the first contact regions, a plurality of second contact plugs extending from an upper surface the insulating interlayer to the second contact regions and a first connecting pattern protruding from a sidewall of at least one contact plug selected from the first and second contact plugs. The second contact regions may have surface heights different from surface heights of the first contact regions. An upper surface of the first connecting pattern may be substantially coplanar with upper surfaces of the first and second contact plugs and the insulating interlayer.

As illustrated above, in the semiconductor device, the contact plugs and the first connecting pattern electrically connected to the contact plugs may form a wiring structure having a single body structure. That is, there may be no separation between a connecting portion of one of the contact plugs and the first connecting pattern. Or, in other words, the interface may have a thickness of zero. Thus, failures due to the interface or the boundary between one of the contact plugs and the first connecting pattern may decrease.

BRIEF DESCRIPTION OF THE DRAWINGS

FIG. 3 is a perspective view of a first structure including a connecting pattern in semiconductor device in accordance with example embodiments;

FIG. 4 is a plan view illustrating a semiconductor device in accordance with example embodiments;

FIGS. 31 and 32 are cross-sectional views illustrating a method of manufacturing a semiconductor device in accordance with example embodiments.

DESCRIPTION OF EMBODIMENTS

Example embodiments will be more clearly understood from the following detailed description taken in conjunction with the accompanying drawings.

Figure 1A:
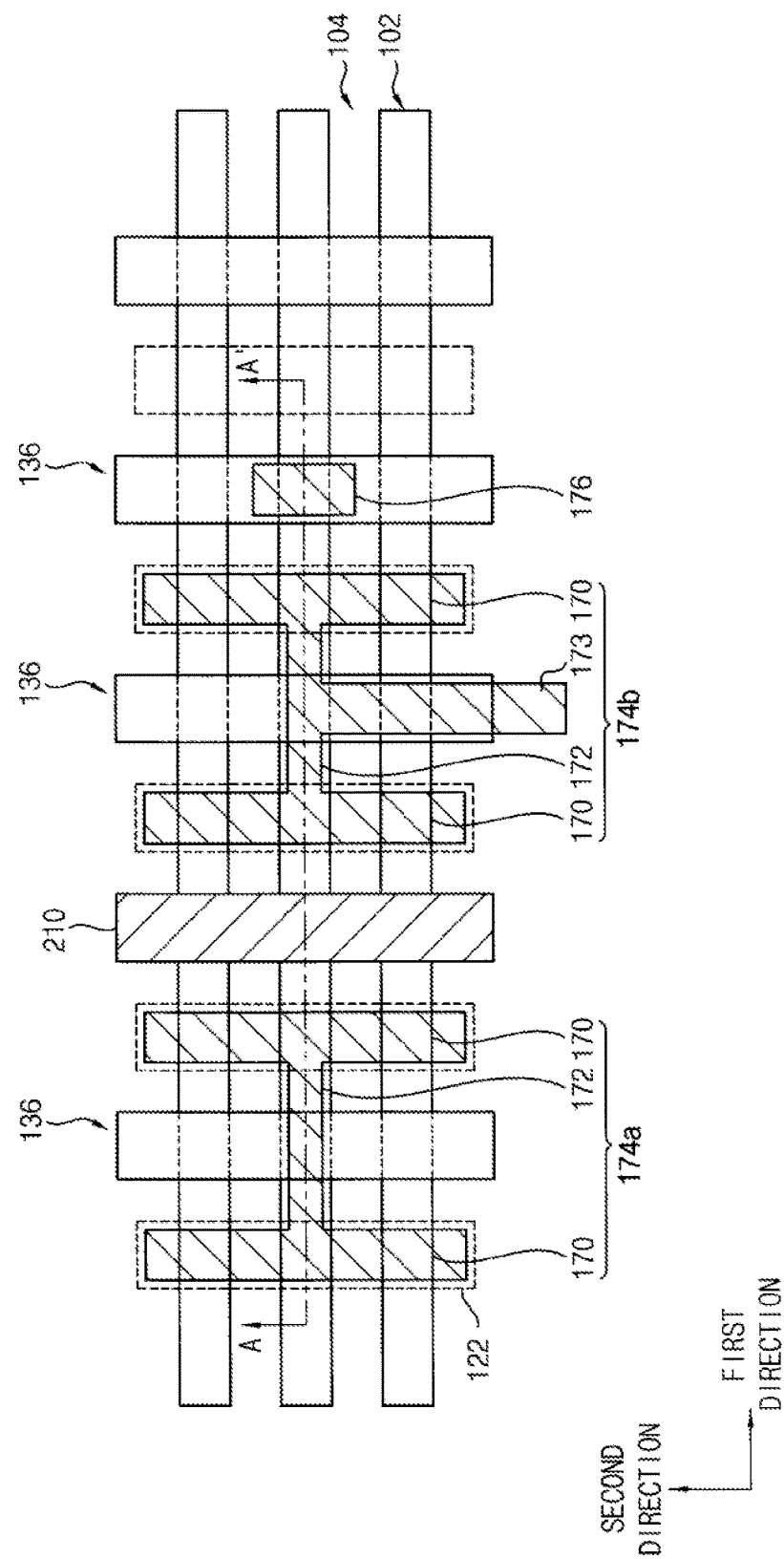
FIGS. 1A and 2A are a plan view and a cross-sectional view illustrating a semiconductor device in accordance with example embodiments.
Figure 2A:
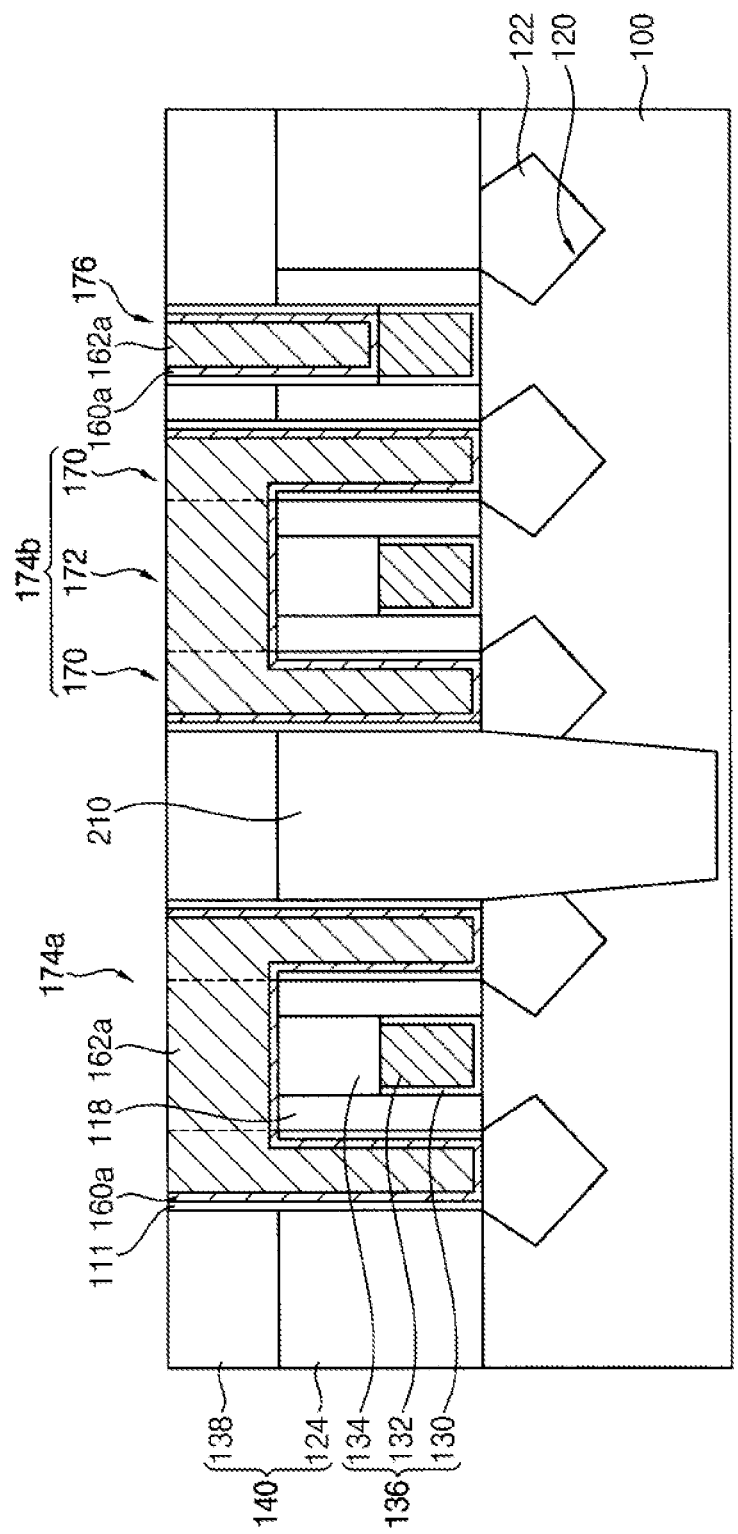

FIGS. 1A and 2A are a plan view and a cross-sectional view illustrating a semiconductor device in accordance with example embodiments. FIG. 3 is a perspective view of a first structure including a connecting pattern in semiconductor device in accordance with example embodiments.

FIG. 2A is a cross-sectional view taken along line A-A' of FIG. 1A. In FIG. 1A, some elements, e.g., a spacer and a first insulating interlayer are omitted. In some embodiments, the semiconductor device may include a fin-field effect transistor (FinFET).

Referring to FIGS. 1a, 2a and 3, the semiconductor device may be formed on a substrate 100 including active patterns. One or more gate structures 136 may be formed on the substrate 100, and may include a gate insulation layer 130, a gate electrode 132 and a capping pattern 134. In some cases, the gate insulation layer 130, the gate electrode 132 and the capping pattern 134 may be stacked in a vertical formation. The active patterns and the gate structures 136 may be covered by a first insulating interlayer 140 on the substrate 100. In some cases, the first insulating interlayer 140 may cover at least a portion of the active patterns and the gate structures 136.

A plurality of first contact plugs 170 may extend through the first insulating interlayer 140 to contact surfaces of the active patterns adjacent to the gate structure 136. At least one second contact plug 176 may extend through the first insulating interlayer 140 to contact a gate electrode 132. A first connecting pattern 172 may directly contact a portion of the sidewalls of the first contact plug 170. The semiconductor device may further include an isolation layer 104, spacers 118, an insulation liner 111, a third connecting pattern 173 and a single diffusion break pattern 210, etc.

According to an exemplary embodiment, upper surfaces of the first contact plugs 170, the second contact plug 176 and/or the connecting pattern 172 may be coplanar with each other. In some cases, the upper surfaces of the first contact plugs 170, the second contact plug 176 and/or the connecting pattern 172 may also be coplanar with an upper surface of the first insulating interlayer 140. In some examples, a structure including two or more of the first contact plugs 170, the second contact plug 176 and the connecting pattern 172 may have a single body structure. That is, there may be no separation between connecting portions of the first contact plugs 170, the second contact plug 176, and/or the connecting pattern 172 (i.e., the interface between them may have a thickness or measure that is substantially zero).

For example, the semiconductor device illustrated in FIGS. 1a, 2a and 3 may include a metal pattern having a single body structure as described above and a barrier, such as barrier pattern 160a, surrounding one or more sidewalls and at least a portion of a bottom surface of the metal pattern. However, the barrier pattern 160a may not be present at the connection portion between the first contact plugs 170 (or the second contact plug 176) and the connecting pattern 172. This may reduce the likelihood of contact failure between the first contact plugs 170 (or the second contact plug 176) and the connecting pattern 172.

In some embodiments, the substrate 100 may include, e.g., a single crystal silicon. In some embodiments, the substrate 100 may be a silicon-on-insulator (SOI) substrate, or a germanium-on-insulator (GOI) substrate.

In example embodiments, the active patterns may include an active fin 102 protruding upwardly from an upper surface of the substrate 100 and an epitaxial structure 122 formed in a recess 120 of the active fin 102. In some example embodiments, the active patterns may include the active fin protruding upwardly from an upper surface of the substrate 100, but where the active fin has no recess, and the active pattern has no epitaxial structure.

In example embodiments, the recess 120 may be disposed at the active fin 102 adjacent to the gate structure 136. Thus, the active fin 102 under the gate structure 136 may protrude further from the substrate 100 relative to the recess 120.

In example embodiments, the active fin 102 may be formed by etching a portion of the substrate 100, so that active fin 102 may be comprised of a material substantially the same as a material of the substrate 100. In example embodiments, a plurality of active fins 102 may be arranged in a second direction perpendicular to the first direction.

In example embodiments, a plurality of recesses 120 and active fins 102 arranged in the second direction may be arranged in a line with each other. Portions of the epitaxial structure 122 may be formed in the recesses 120. In some cases, the epitaxial structure 122 may be formed by sidewalls of neighboring epitaxial patterns in the second direction being connected to each other in a single pattern. That is, the epitaxial structure 122 may be formed at the recesses 120 and at an area between the recesses 120.

The epitaxial structure 122 may include impurity regions serve as source/drain regions of a FinFET. For example, the epitaxial structure 122 may be doped with impurities. An upper surface of the epitaxial structure 122 may comprise a first contact region.

In example embodiments, the epitaxial structure 122 may include silicon or silicon germanium. When the FinFET is a negative-channel metal oxide semiconductor (NMOS) transistor, the epitaxial structure 122 may include silicon doped with n-type impurities. When the FinFET has a positive-channel metal oxide semiconductor (PMOS) transistor, the epitaxial structure 122 may include silicon germanium doped with p-type impurities.

The gate structure 136 may extend in the second direction, and cover at least a portion of the surface of the active fin 102. A plurality of gate structures 136 may be spaced apart in the first direction.

The gate insulation layer 130 may include an oxide, e.g., silicon oxide, or a metal oxide having a high dielectric constant, e.g., hafnium oxide, tantalum oxide, zirconium oxide, etc. In example embodiments, the gate insulation layer 130 may include a silicon oxide layer and a metal oxide layer, which may be sequentially stacked. The gate insulation layer 130 may surround sidewalls and a bottom surface of the gate electrode 132.

The gate electrode 132 may be comprised of a material having a low resistance, e.g., a metal such as aluminum, copper, tantalum, etc., or a metal nitride thereof. Alternatively, the gate electrode 132 may include, e.g., polysilicon.

The capping pattern 134 may be formed on the gate insulation layer 130 and/or the gate electrode 132. The capping pattern 134 may include an insulation material having an etching selectivity with respect to silicon oxide. The capping pattern 134 may include a nitride, e.g., silicon nitride.

In example embodiments, spacers 118 may be formed on sidewalls of the gate structure 136, and may include a nitride, e.g., silicon nitride, silicon oxycarbonitride (SiOCN), etc. In example embodiments, the spacers 118 may be comprised of a material substantially the same as a material of the capping pattern 134.

An upper surface of the gate electrode 132 may comprise a second contact region. The second contact region may have a surface height different from a surface height of the first contact region.

In example embodiments, the isolation layer 104 may partially fill a lower portion of a trench between the active fins 102. An upper surface of the active fin 102 may be higher than an upper surface of the isolation layer 104. The isolation layer 104 may include an oxide, e.g., silicon oxide.

The single diffusion break pattern 210 may be formed at a cut out portion of the active fins 102, which may extend in the first direction. That is, the single diffusion break pattern 210 may contact an end portion in the first direction of the active fin 102. In another example, the single diffusion break pattern 210 may be formed between the active fins 102 in the first direction. The single diffusion break pattern 210 may extend in the second direction. An upper surface of the single diffusion break pattern 210 may be substantially coplanar with an upper surface of the gate structure 136. A lower surface of the single diffusion break pattern 210 may be lower than a lower surface of the active fin 102. That is, a portion of the active fin 102 protruding from the substrate 100 corresponding to the single diffusion break pattern 210 may be removed. In example embodiments, the lower surface of the single diffusion break pattern 210 may contact the isolation layer 104 and a planar surface of the substrate 100.

The single diffusion break pattern 210 may include, e.g., silicon nitride. Neighboring ones of active fins 102 in the first direction may be isolated by the single diffusion break pattern 210.

In example embodiments, the single diffusion break pattern 210 may have a width in the first direction substantially the same as a width in the first direction of the gate structure 136.

The first insulating interlayer 140 may be formed on the substrate to cover the active patterns, the isolation layer 104 and the gate structures 136. In example embodiments, an upper surface of the first insulating interlayer 140 may be flat. The upper surface of the first insulating interlayer 140 may be higher than an upper surface of the gate structure 136. The first insulating interlayer 140 may include, e.g., silicon oxide.

In example embodiments, the first insulating interlayer 140 may include a lower insulating interlayer 124 filling a gap between the gate structures 136 and an upper insulating interlayer 138 on the lower insulating interlayer 124 and the gate structure 136.

An upper surface of the first contact plug 170 may be substantially coplanar with the upper surface of the first insulating interlayer 140. That is, a top height of the first contact plug 170 may be substantially the same as a top height of the first insulating interlayer 140.

In example embodiments, the lower surface of the first contact plug 170 may contact an upper surface of the epitaxial structure 122. In example embodiments, the surface of the epitaxial structure 122 contacting the first contact plug 170 may be recessed by over etching. In some example embodiments that do not include an epitaxial structure 122, the first contact plug 170 may contact the active fin 102 adjacent the gate structure 136. In example embodiments, the first contact plug 170 may be electrically connected to the source/drain regions of a FinFET. In example embodiments, the first contact plug 170 may extend in the second direction.

The first connecting pattern 172 may be connected to sidewalls of at least two first contact plugs 170, thereby connecting the at least two first contact plugs 170 to each other. In example embodiments, the first connecting pattern 172 may contact upper sidewalls of the first contact plugs 170, and may extend in the first direction.

Figure 2B:
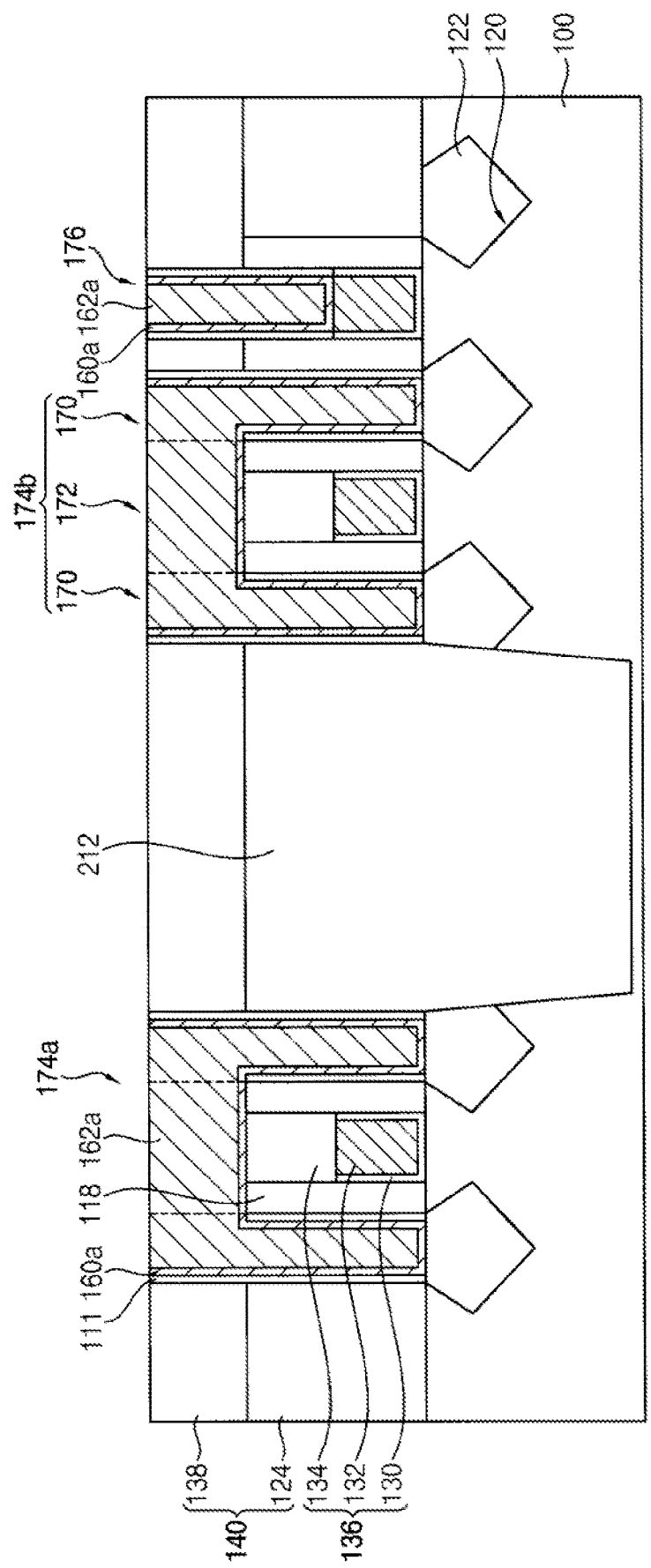

In example embodiments, as shown in FIGS. 2A and 2B, a cross section of the interface between the first contact plug 170 and the first connecting pattern 172 may extend in a vertical direction. In some example embodiments, the interface between the first contact plug 170 and the first connecting pattern 172 may have a rounded shape. In this case, a sidewall profile of the gate structure 136 may also be rounded.

An upper surface of the first connecting pattern 172 may be substantially coplanar with the upper surfaces of the first contact plugs 170 and the first insulating interlayer 140. A lower surface of the first connecting pattern 172 may be higher than lower surfaces of the first contact plugs 170 and second contact plugs 176. In example embodiments, the lower surface of the first connecting pattern 172 may be higher than the upper surface of the gate electrode 132 in the gate structure 136.

In example embodiments, the first contact plugs 170 and the first connecting pattern 172 electrically connected to the first contact plugs 170 may comprise a first structure 174a having a single body structure. That is, there may be no separation between connecting portions of one of the first contact plugs 170 and the first connecting pattern 172 (i.e., the interface between them may have a thickness that is substantially zero).

The first structure 174a may include a first metal pattern 162a and a first barrier pattern 160a surrounding sidewalls and a bottom surface of the first metal pattern 162a. The connecting portion between one of the first contact plugs 170 and the first connecting pattern 172 may comprise the first metal pattern 162a. That is, the first barrier pattern 160a may not be present at the connecting portion between one of the first contact plugs 170 and the first connecting pattern 172.

In some example embodiments, the first structure 174b may include the first contact plugs 170, the first connecting pattern 172 (which may be electrically connected to the first contact plugs 170), and the third connecting pattern 173 protruding from the sidewall of the first connecting pattern 172. An upper surface of the third connecting pattern 173 may be substantially coplanar with the upper surface of the first connecting pattern 172. A lower surface of the third connecting pattern 173 may be higher than the upper surface of the gate electrode 132 in the gate structure 136. In example embodiments, the third connecting pattern 173 may extend in the second direction.

The first contact plugs 170, the first connecting pattern 172 and the third connecting pattern 173 may be a single body structure that also includes the first metal pattern 162a. That is, the first barrier pattern 160a may not be present at a connecting portion between the first connecting pattern 172 and the third connecting pattern 173.

The first metal pattern 162a may include, e.g., cobalt, aluminum, copper, tungsten, nickel, platinum, Au, Ag, etc. The first barrier pattern 160a may include, e.g., titanium, titanium nitride, tantalum, tantalum nitride, etc.

In example embodiments, an insulation liner 111 may be formed on sidewalls of the first structure 174a and 174b. The insulation liner 111 may not be present under bottoms of the first and second contact plugs 170 and 176. The insulation liner 111 may include, e.g., silicon nitride, SiCN, etc. In some example embodiments, the insulation liner 111 may not be present on the sidewalls of the first structure 174a and 174b.

An upper surface of the second contact plug 176 may be substantially coplanar with the upper surface of the first insulating interlayer 140. That is, upper surfaces of the first contact plug 170, the second contact plug 176, the first insulating interlayer 140, the first and third connecting patterns 172 and 173 may be substantially coplanar with each other.

In some embodiments, the second contact plug 176 may include the first barrier pattern 160a and the first metal pattern 162a. In example embodiments, the insulation liner 111 may be formed on sidewalls of the second contact plug 176. In some example embodiments, the insulation liner 111 may not be present on sidewalls of the second contact plug 176.

As described above, the first and third connecting patterns 172 and 173 may not be present over upper surfaces of the first contact plug 170, the second contact plug 176 and the first insulating interlayer 140. In the first structures 174a and 174b, there may be no separation between the connecting portions of the first contact plug 170 and the first connecting pattern 172 and the connecting portions of the first contact plugs 170 and the third connecting pattern 173 (i.e., the interface between them may have a thickness or measure that is substantially zero). This may result in a decrease in contact failures, e.g., electrically open or high resistance between the first contact plug 170 and the first connecting pattern 172 and between the first contact plugs 170 and the third connecting pattern 173.

Figure 1B:
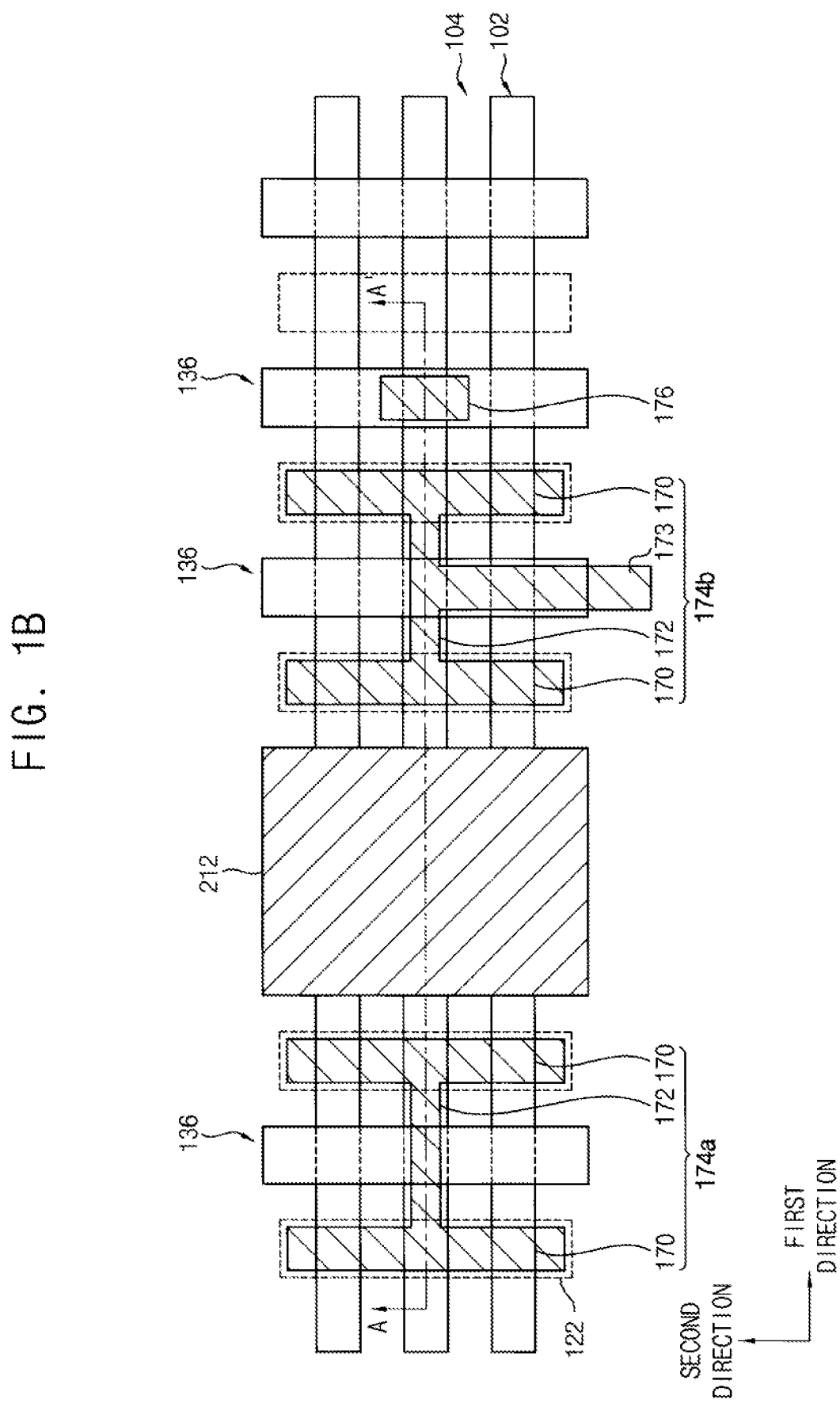
FIGS. 1B and 2B are a plan view and a cross-sectional view illustrating a semiconductor device in accordance with example embodiments.

FIGS. 1B and 2B are a plan view and a cross-sectional view illustrating a semiconductor device in accordance with example embodiments.

FIG. 2B is a cross-sectional view taken along line A-A' of FIG. 1B.

The semiconductor device shown in FIGS. 1B and 2B may be substantially the same as that illustrated with reference to FIGS. 1A and 2A, except for a double diffusion break pattern 212.

Referring to FIGS. 1B and 2B, the double diffusion break pattern 212 may have functions substantially the same as functions of the first single diffusion break pattern illustrated with reference to FIGS. 1A and 2A The double diffusion break pattern 212 may be formed at a cut out portion of the active fins 102 extending in the first direction. The double diffusion break pattern 212 may extend in the second direction. An upper surface of the double diffusion break pattern 212 may be substantially coplanar with the upper surface of the gate structure 136. A lower surface of the double diffusion break pattern 212 may be lower than the lower surface of the active fin 102. That is, the portion of the active fin 102 protruding from the substrate 100 in the area corresponding to the double diffusion break pattern 212 may be removed.

In some embodiments, the double diffusion break pattern 212 may have a width in the first direction greater than a width in the first direction of the single diffusion break pattern 210. In example embodiments, the width in the first direction of the double diffusion break pattern 212 may be substantially the same as sum of widths in the first direction of the two gate structures 136 and a gap between the two gate structures 136.

FIG. 4 is a plan view illustrating a semiconductor device in accordance with example embodiments. The semiconductor device shown in FIG. 4 may be substantially the same as that illustrated with reference to FIGS. 1A and 2A, except for a layout of the first and third connecting patterns 172 and 173.

Referring to FIG. 4, the first connecting pattern 172 may be connected to upper sidewalls of two first contact plugs 170.

In example embodiments, a plurality first connecting patterns 172 may extend in the first direction to connect the first contact plugs 170 to each other. The first contact plugs 170 may extend in the second direction, and may be spaced apart in the first direction.

In example embodiments, the third connecting pattern 173 may be connected with at least two first connecting patterns 172. For example, the third connecting pattern 173 may extend in the second direction to connect at least two first connecting patterns 172 extending in the first direction. In this case, the third connecting pattern 173 may extend in the second direction, and contact the sidewalls of the first connecting patterns 172. Connecting portions of the first contact plugs 170, the second and the third connecting patterns 172 and 173 may comprise direct connections with no separation (i.e., the interface may have a thickness or measure that is substantially zero).

In example embodiments, a single diffusion break pattern 210 may be formed at a cut out portion of the active fins 102 extending in the first direction. The single diffusion break pattern 210 may extend in the second direction (i.e., the single diffusion break pattern 210 may have a length in the second direction greater than a width in the first direction). In some example embodiments, the double diffusion break pattern 212, extending in the second direction, may be formed at a cut out portion of the active fins 102 extending in the first direction.

Figure 5:
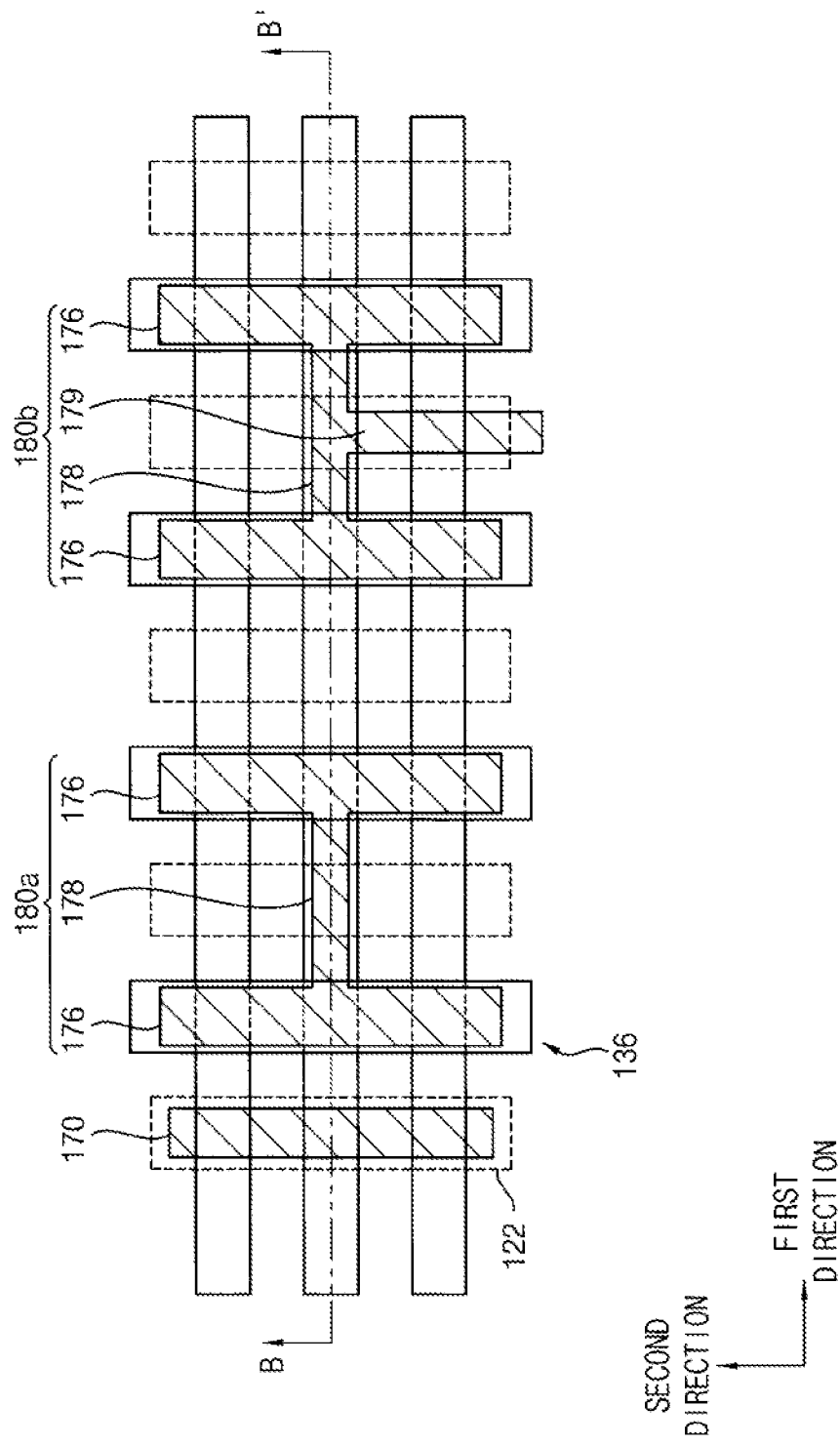
FIGS. 5 and 6 are a plan view and a cross-sectional view illustrating a semiconductor device in accordance with example embodiments.
Figure 6:
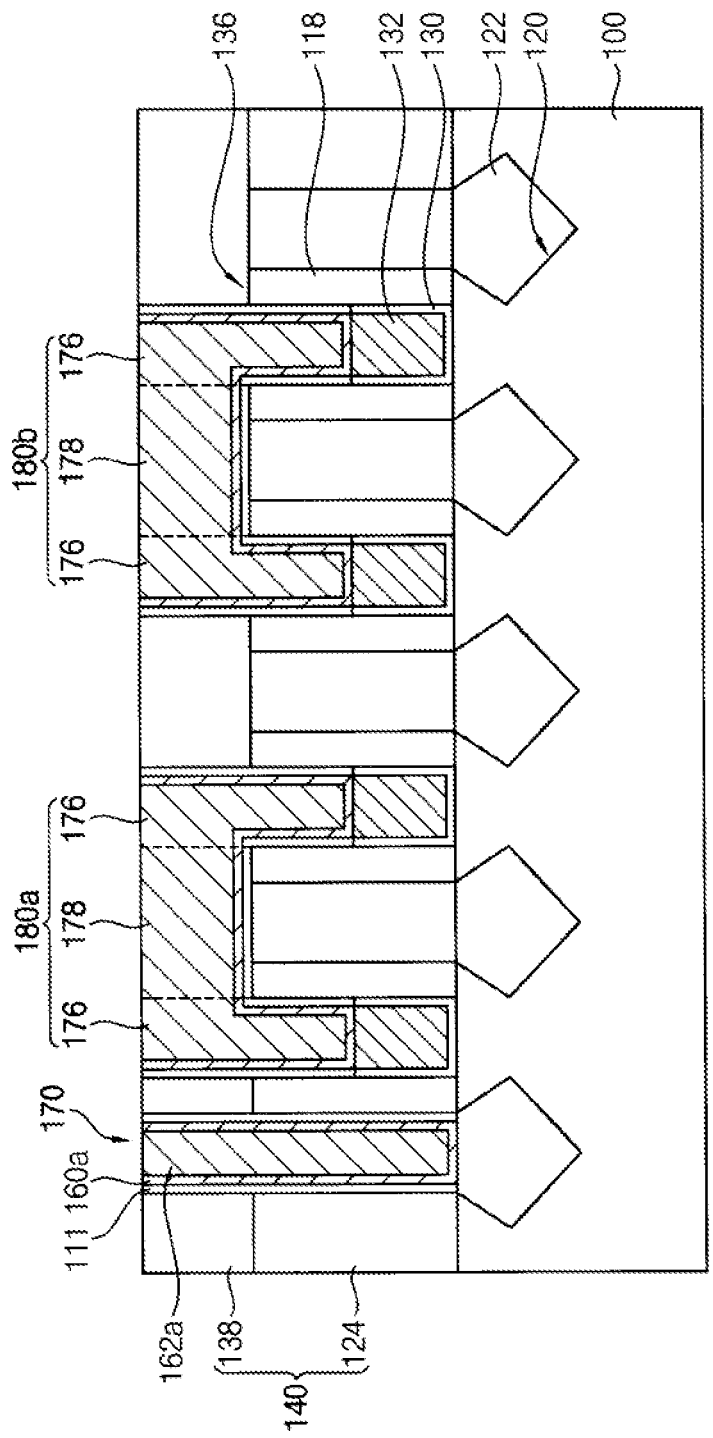

FIG. 5 is a plan view illustrating a semiconductor device in accordance with example embodiments. FIG. 6 is a cross-sectional view illustrating a semiconductor device in accordance with example embodiments.

FIG. 6 is a cross-sectional view taken along line B-B' of FIG. 5.

In the semiconductor device shown in FIGS. 5 and 6, the active pattern, the gate structure, the first insulating interlayer and the epitaxial structure may be substantially the same as those illustrated with reference to FIGS. 1A and 2A and 3.

Referring to FIGS. 5 and 6, the first contact plug 170 may extend through the first insulating interlayer 140, and may contact the upper surface of the epitaxial structure 122 adjacent to the gate structure 136.

The second contact plug 176 may extend through the first insulating interlayer 140, and may contact the gate electrode 132 in the gate structure 136.

A second connecting pattern 178 may be electrically connected to sidewalls of at least two second contact plugs 176. The second connecting pattern 178 may extend to contact upper sidewalls of the second contact plugs 176. In example embodiments, the second connecting pattern 178 may extend in the first direction.

An upper surface of the second connecting pattern 178 may be substantially coplanar with upper surfaces of the first contact plug 170, the first insulating interlayer 140 and the second contact plug 176. A lower surface of the second connecting pattern 178 may be higher than a lower surface of the second contact plug 176. That is, the lower surface of the second connecting pattern 178 may be higher than the upper surface of the gate electrode 132.

In example embodiments, the second connecting pattern 178 and the second contact plugs 176, which may be electrically connected to the second connecting pattern 178, may comprise a second structure 180a having a single body structure. That is, connecting portions of the second connecting pattern 178 and one of the second contact plugs 176 may comprise a direct connection with no separation (i.e., the interface may have a thickness or measure that is substantially zero).

In some example embodiments, the second structure 180b may include the second connecting pattern 178, the second contact plugs 176 electrically connected to the second connecting pattern 178 and a fourth connecting pattern 179 protruding from a sidewall of the second connecting pattern 178. For example, the fourth connecting pattern 179 may extend in the second direction. Upper wiring regions of the second contact plugs 176 connected by the second connection pattern 178 may be moved or expanded by the fourth connecting pattern 179.

The second structure 180a and 180b may include the first metal pattern 162a and the first barrier pattern 160a surrounding the sidewalls and bottom surface of the first metal pattern 162a. The first barrier pattern 160a may not be present at a connecting portion between the second connecting pattern 178 and the second contact plug 176 and a connecting portion between the second and fourth connecting patterns 178 and 179.

In example embodiments, the insulation liner 111 may be formed on sidewalls of the second structure 180a and 180b. In some example embodiments, the insulation liner 111 may not be present on the sidewalls of the second structure 180a and 180b.

The first contact plug 170 may include the first metal pattern 162a and the first barrier pattern 160a.

In example embodiments, as that illustrated with reference to FIGS. 1A, 2A and 3, the first contact plugs 170 may be connected to the first connecting pattern 172. In some example embodiments, the first contact plugs 170 may be connected to the first connecting pattern 172 and the third connecting pattern 173.

As described above, the second and fourth connecting patterns 178 and 179 may not be present over upper surfaces of the first contact plug 170, the second contact plug 176 and the first insulating interlayer 140.

Figure 7:
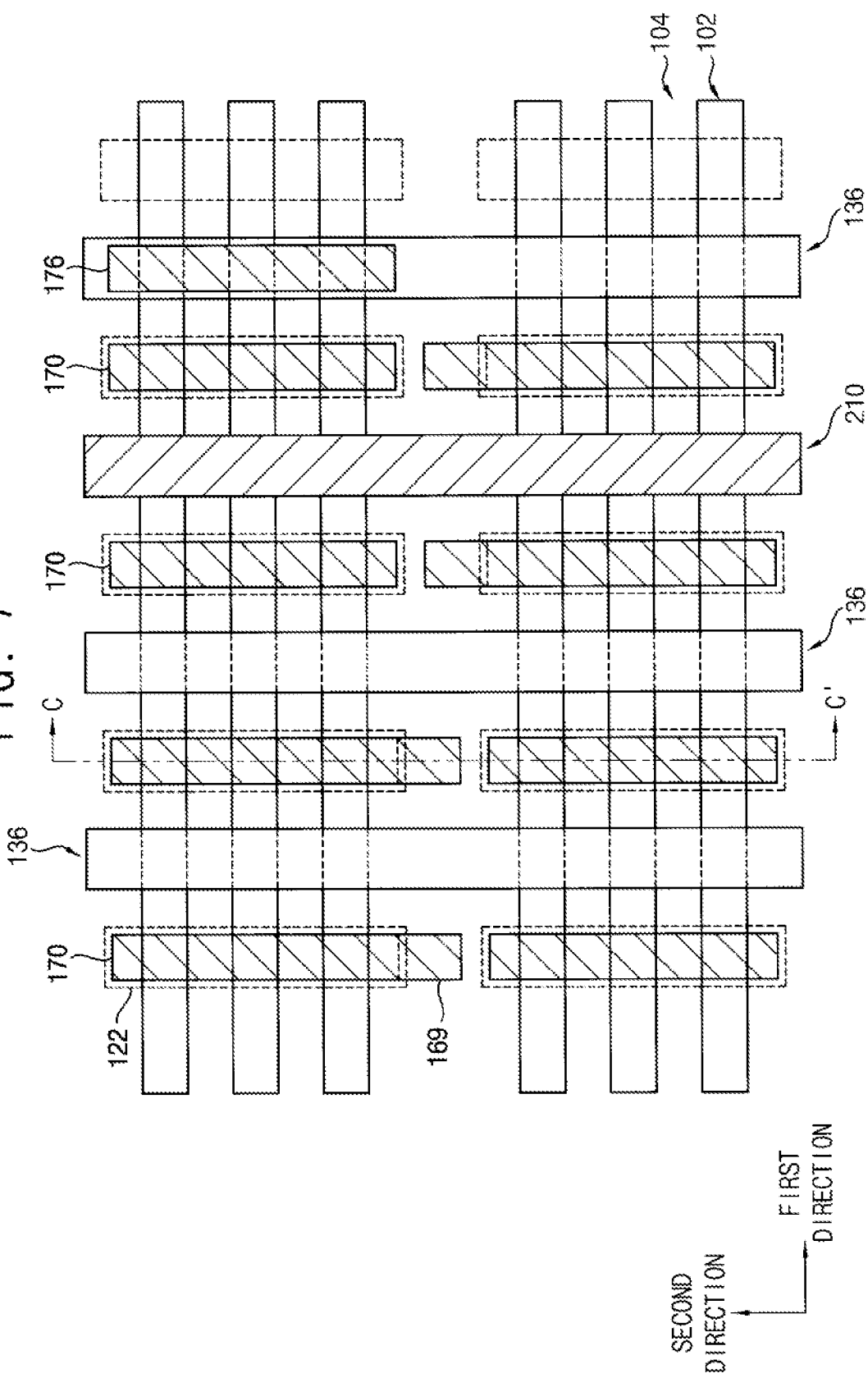
FIGS. 7 and 8 are a plan view and a cross-sectional view illustrating a semiconductor device in accordance with example embodiments.
Figure 8:
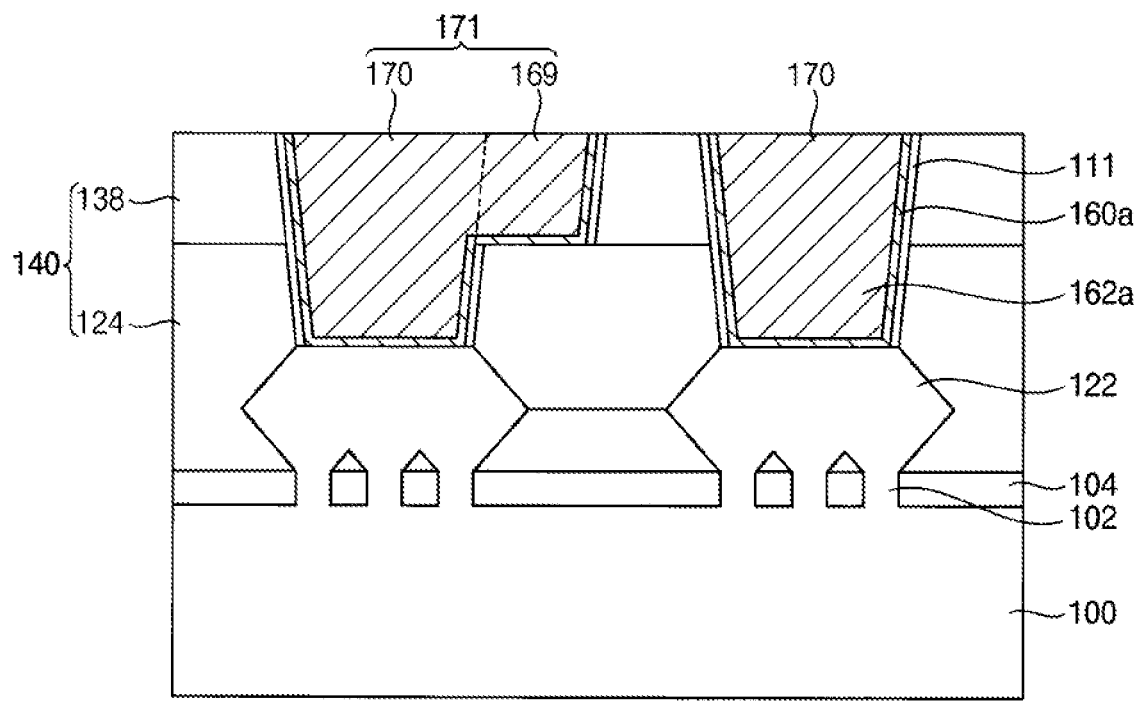

FIG. 7 is a plan view illustrating a semiconductor device in accordance with example embodiments. FIG. 8 is a cross-sectional view illustrating a semiconductor device in accordance with example embodiments.

FIG. 8 is a cross-sectional view taken along line C-C' of FIG. 7.

The semiconductor device shown in FIGS. 7 and 8 may be substantially the same as that illustrated with reference to FIGS. 1A, 2A and 3, except for connecting patterns. In the semiconductor device shown in FIGS. 7 and 8, the active pattern, the gate structure, the first insulating interlayer and the epitaxial structure may be substantially the same as that illustrated with reference to FIGS. 1A, 2A and 3.

Referring to FIGS. 7 and 8, the gate structure 136 may extend to cross the active fins 102 in the second direction. A plurality of epitaxial structures 122 may be adjacent to sides of the gate structures 136. The epitaxial structures 122 may be arranged in the second direction.

The first contact plug 170 may extend through the first insulating interlayer 140, and may contact the upper surface of each of the epitaxial structures 122. In example embodiments, a plurality of first contact plugs 170 may be arranged in the second direction.

The second contact plug 176 may extend through the first insulating interlayer 140, and may contact the gate electrode 132 in the gate structure 136.

A connecting pattern 169 may protrude from the sidewall of the first contact plug 170. Upper wiring regions of the first contact plugs 170 connected by the connecting pattern 169 may be moved or expanded by the connecting pattern 169. In example embodiments, the connecting pattern 169 may not contact a sidewall of a neighboring first contact plug 170.

An upper surface of the connecting pattern 169 may be substantially coplanar with upper surfaces of the first contact plug 170, the first insulating interlayer 140 and the second contact plug 176. A lower surface of the connecting pattern 169 may be higher than a lower surface of the first contact plug 170. That is, the lower surface of the connecting pattern 169 may be higher than the upper surface of the gate electrode 132.

In example embodiments, the connecting pattern 169 and the first contact plugs 170, which may be electrically connected to the connecting pattern 169, may comprise a wiring structure 171 having a single body structure. That is, connecting portions of the connecting pattern 169 and one of the first contact plugs 170 may form a direct connection with no separation (i.e., the interface may have a thickness or measure that is substantially zero).

The wiring structure 171 may include the first metal pattern 162a and the first barrier pattern 160a surrounding the sidewalls and bottom surface of the first metal pattern 162a.

In example embodiments, the insulation liner 111 may be formed on sidewalls of the wiring structure 171.

The second contact plug 176 may include the first metal pattern 162a and the first barrier pattern 160a.

In example embodiments, a single diffusion break pattern 210 extending in the second direction may be formed at a cut out portion of the active fins 102. In some example embodiments, a double diffusion break pattern 212 extending in the second direction may be formed at a cut out portion of the active fins 102.

In example embodiments, as shown in FIGS. 5 and 6, one of the second contact plugs 176 may be connected to the second connecting pattern 178. In some example embodiments, as shown in FIGS. 5 and 6, one of the second contact plugs 176 may be connected to the second connecting pattern 178 and the fourth connecting pattern 179.

In example embodiments, as that illustrated with reference to FIGS. 1A, 2A and 3, one of the first contact plugs may be connected to the first connecting pattern. In some example embodiments, one of the first contact plugs may be connected to both the first connecting pattern and the third connecting pattern.

Figure 9:
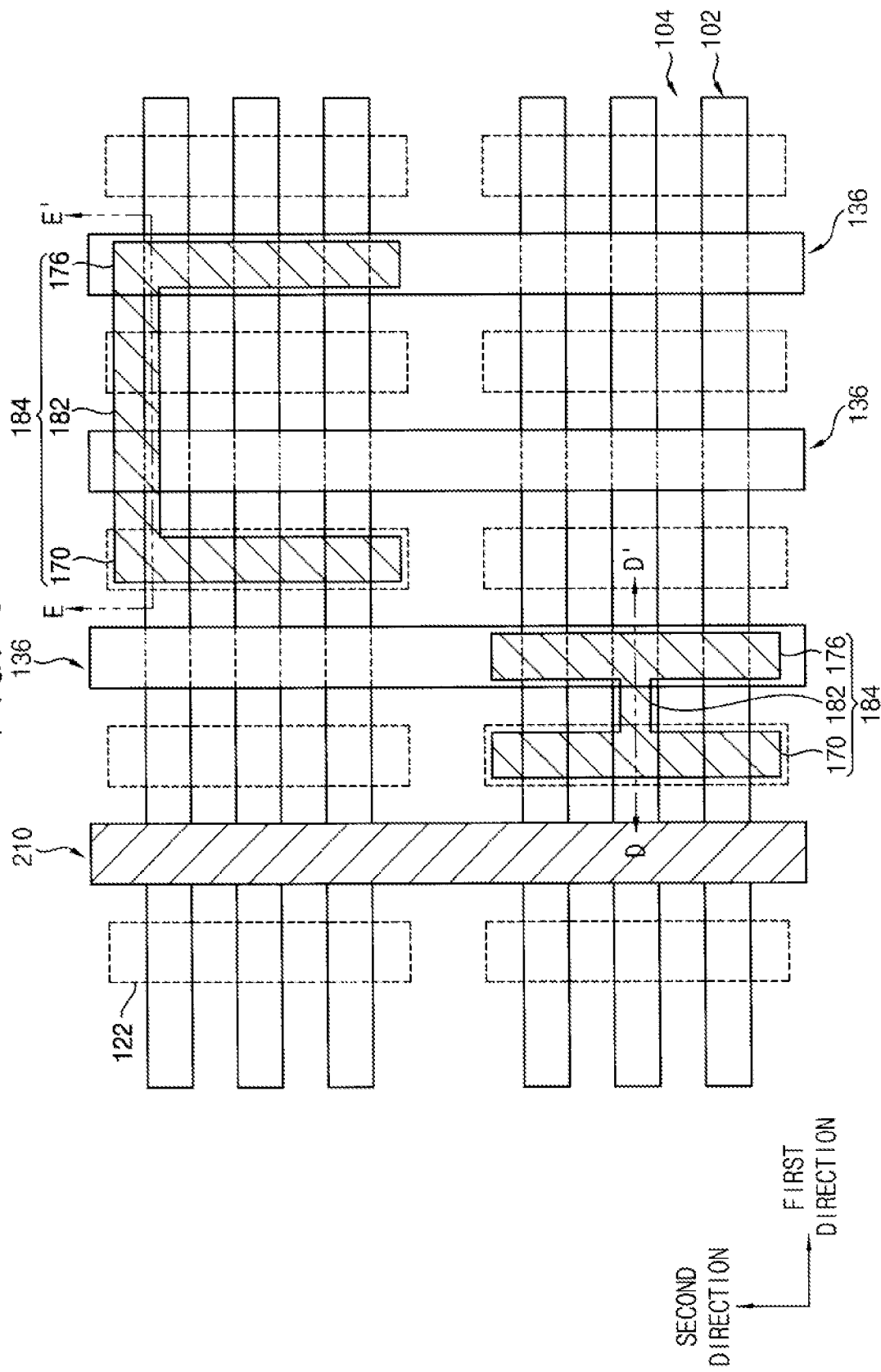
FIGS. 9 and 10 are a plan view and a cross-sectional view illustrating a semiconductor device in accordance with example embodiments.
Figure 10:
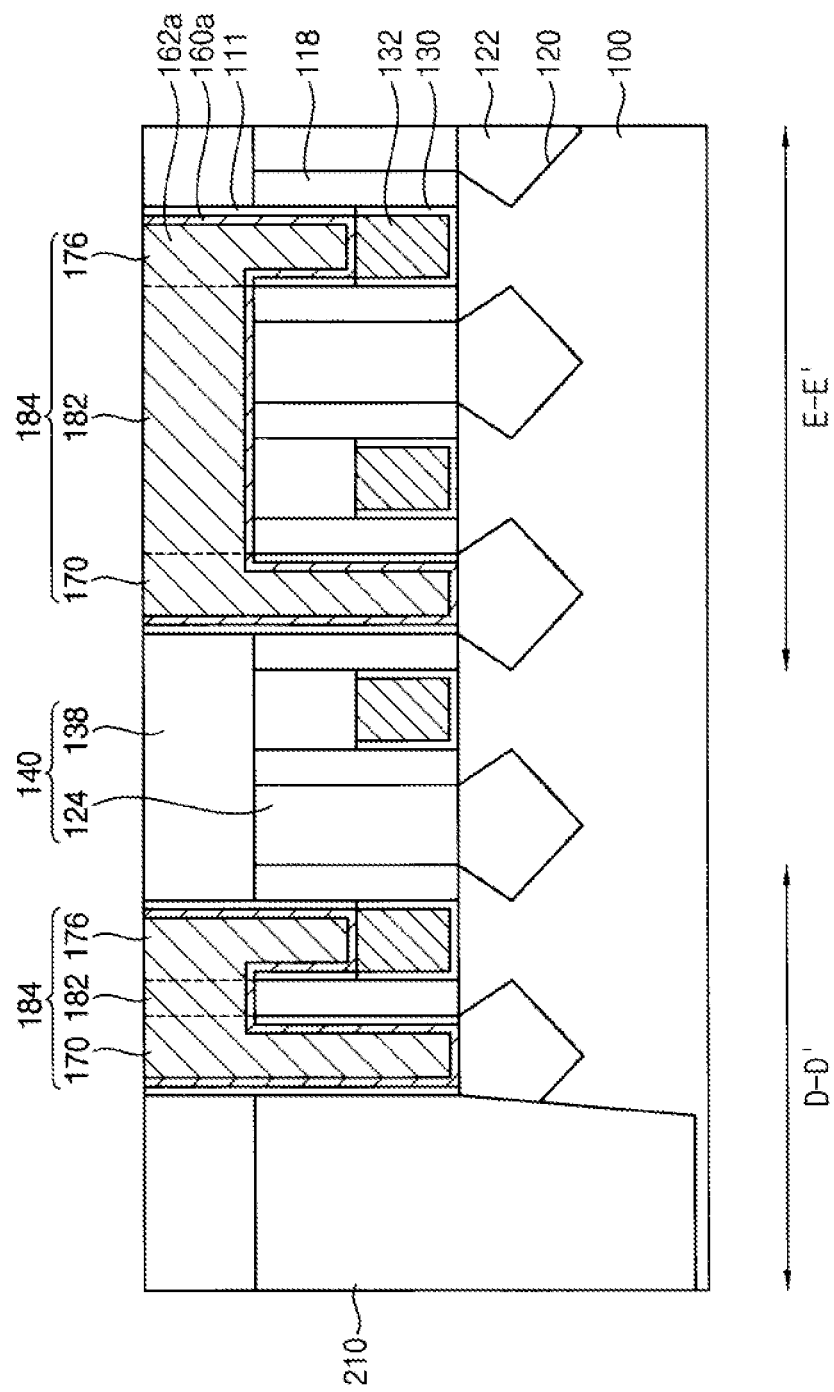

FIG. 9 is a plan view illustrating a semiconductor device in accordance with example embodiments. FIG. 10 is a cross-sectional view illustrating a semiconductor device in accordance with example embodiments.

FIG. 10 is cross-sectional views taken along line D-D' and E-E' of FIG. 9.

The semiconductor device shown in FIGS. 9 and 10 may be substantially the same as that illustrated with reference to FIGS. 1A, 2A and 3, except for connecting patterns. In the semiconductor device shown in FIGS. 7 and 8, the active pattern, the gate structure, the first insulating interlayer and the epitaxial structure may be substantially the same as those illustrated with reference to FIGS. 1A, 2A and 3.

Referring to FIGS. 9 and 10, the gate structure 136 may extend to cross active fins 102. The epitaxial structures 122 may be adjacent to sides of the gate structures, respectively. The epitaxial structures 122 may be arranged in the second direction.

The first contact plug 170 may extend through the first insulating interlayer 140, and may contact the upper surface of each of the epitaxial structures 122.

The second contact plug 176 may extend through the first insulating interlayer 140, and may contact the gate electrode 132.

A fifth connecting pattern 182 may be electrically connected to the first contact plug 170 and the second contact plug 176. For example, the fifth connecting pattern 182 may extend to contact the sidewall of the first contact plug 170 and the sidewall of the second contact plug 176.

In example embodiments, the fifth connecting pattern 182 may be connected to the first contact plug 170 and a second contact plug 176 which contacts the gate electrode 132 adjacent to the first contact plug 170. In some example embodiments, the fifth connecting pattern 182 may be connected to the first contact plug 170 and a second contact plug 176 which contacts the gate electrode 132 at a location not adjacent to the first contact plug 170.

An upper surface of the fifth connecting pattern 182 may be substantially coplanar with upper surfaces of the first contact plug 170, the first insulating interlayer 140 and the second contact plug 176. A lower surface of the fifth connecting pattern 182 may be higher than a lower surface of the second contact plug 176. That is, the lower surface of the fifth connecting pattern 182 may be higher than the upper surface of the gate electrode 132.

In example embodiments, the fifth connecting pattern 182 and the first and second contact plugs 170 and 176, which may be electrically connected to the fifth connecting pattern 182, may comprise a wiring structure 184 having a single body structure. That is, connecting portions of the fifth connecting pattern 182 and ones of the first and second contact plugs 170 and 176 may comprise a direct connection with no separation (i.e., the interface may have a thickness or measure that is substantially zero).

The wiring structure 184 may include the first metal pattern 162a and the first barrier pattern 160a surrounding the sidewalls and bottom surface of the first metal pattern 162a.

In example embodiments, the insulation liner 111 may be formed on sidewalls of the wiring structure 184.

In example embodiments, a single diffusion break pattern 210 may extend in the second direction, and may be formed at a cut out portion of the active fins 102. In some example embodiments, a double diffusion break pattern may extend in the second direction, and may be formed at a cut out portion of the active fins 102.

In example embodiments, as illustrated with reference to FIGS. 1A, 2A and 3, one of the first contact plugs 170 may be connected to the first connecting pattern. In some example embodiments, one of the first contact plugs 170 may be connected to the first connecting pattern and the third connecting pattern. In some example embodiments, as illustrated with reference to FIGS. 7 and 8, one of the first contact plugs 170 may be connected to a single connecting pattern.

In example embodiments, as that illustrated with reference to FIGS. 5 and 6, one of the second contact plugs 176 may be connected to the second connecting pattern. In some example embodiments, one of the second contact plugs 176 may be connected to both the second connecting pattern and the fourth connecting pattern.

Figure 11:
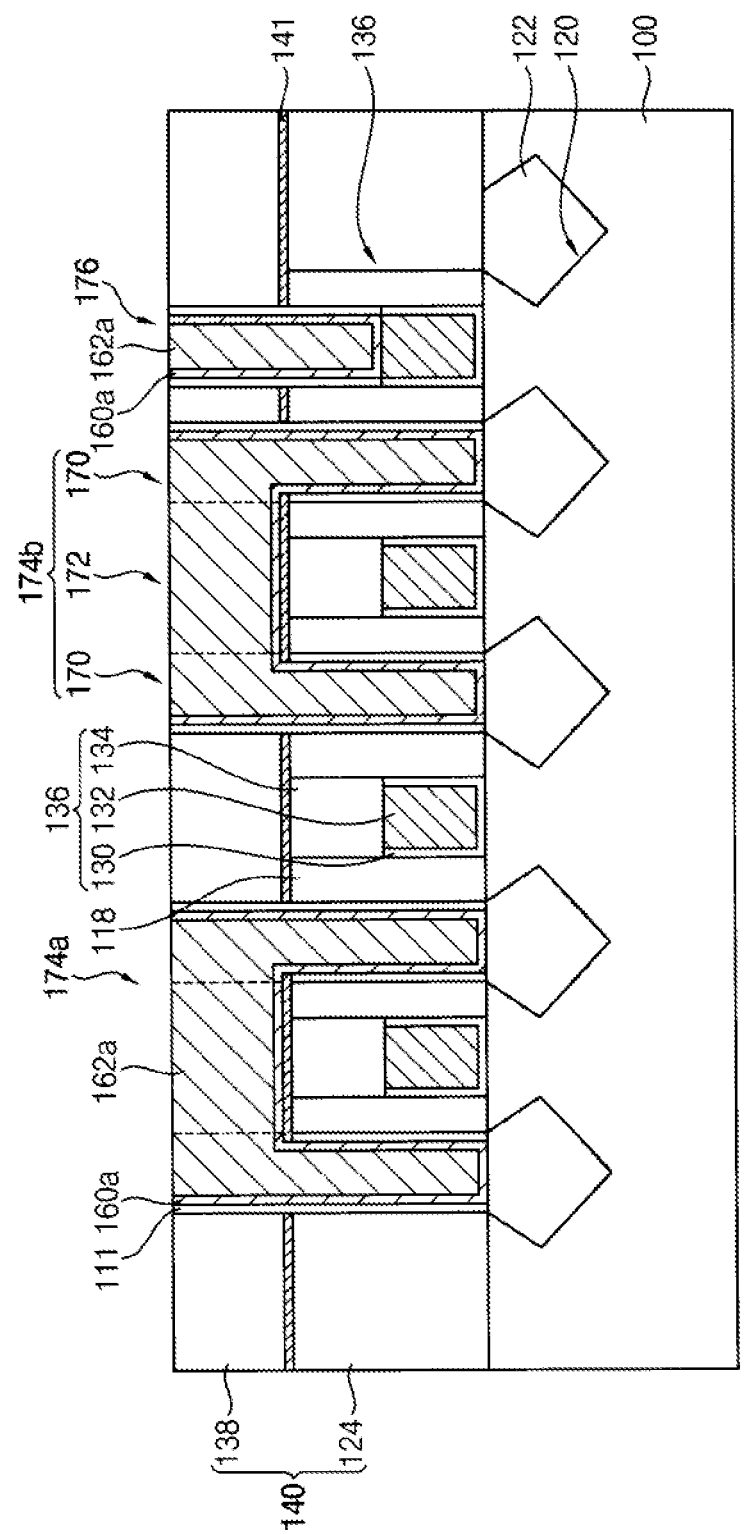
FIG. 11 is a cross-sectional view illustrating a semiconductor device in accordance with example embodiments.

FIG. 11 is a cross-sectional view illustrating a semiconductor device in accordance with example embodiments.

The semiconductor device shown in FIG. 11 may be substantially the same as that illustrated with reference to FIGS. 1A, 2A and 3, except for an etch stop layer.

Referring to FIG. 11, the semiconductor device may include the etch stop layer 141 for controlling bottom heights of the first connecting pattern 172 and the third connecting pattern 173. In example embodiments, the etch stop layer 141 may be formed between the lower insulating interlayer 124 and the upper insulating interlayer 138. In example embodiments, an upper surface of the etch stop layer 141 may have a height substantially the same as the bottom heights of the first and third connecting patterns 172 and 173.

The etch stop layer 141 may be present in the other example embodiments. For example, in the semiconductor devices shown in FIGS. 4 to 10, the etch stop layer 141 may be formed between the lower insulating interlayer 124 and the upper insulating interlayer 138.

FIGS. 12 to 28 are plan views and cross-sectional views illustrating a method of manufacturing a semiconductor device in accordance with example embodiments.

The cross-sectional views are taken along line A-A' of the plan views, respectively.

Figure 12:
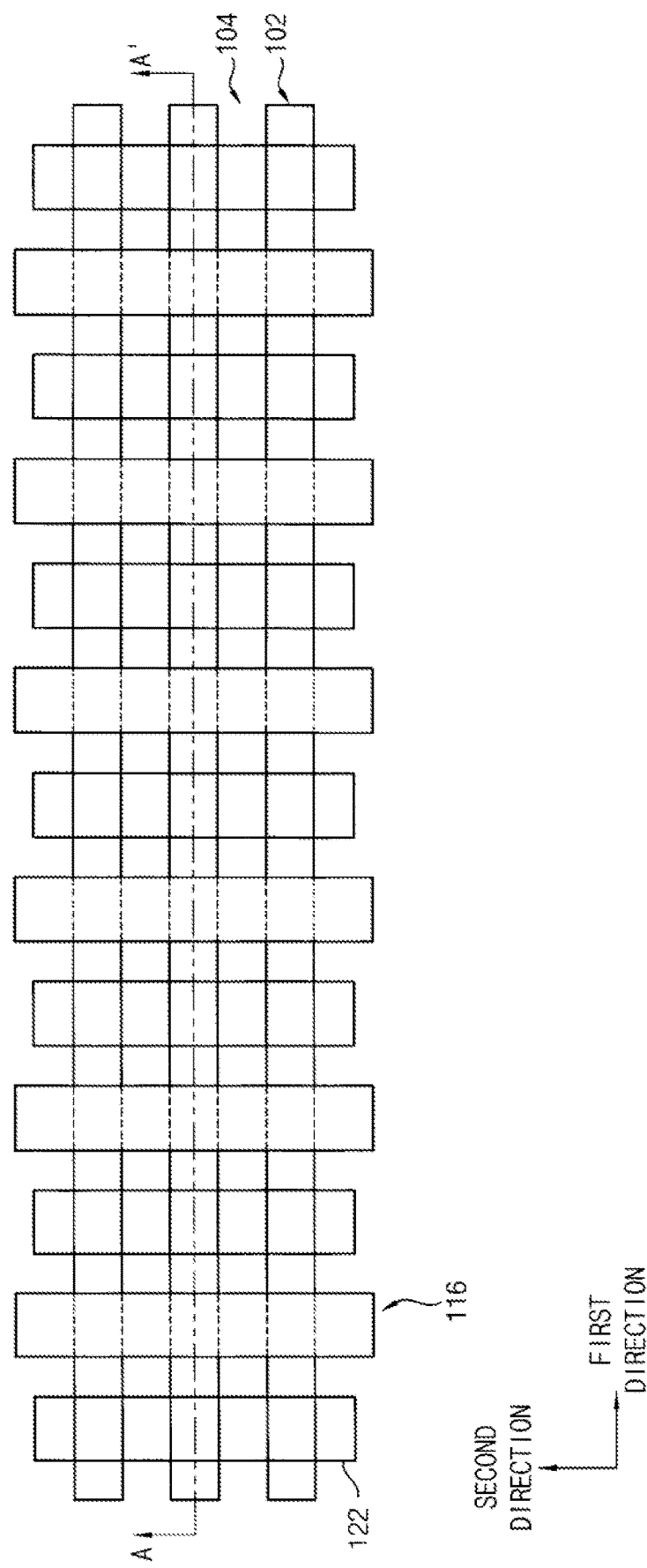
FIGS. 12 to 28 are plan views and cross-sectional views illustrating a method of manufacturing a semiconductor device in accordance with example embodiments.
Figure 13:
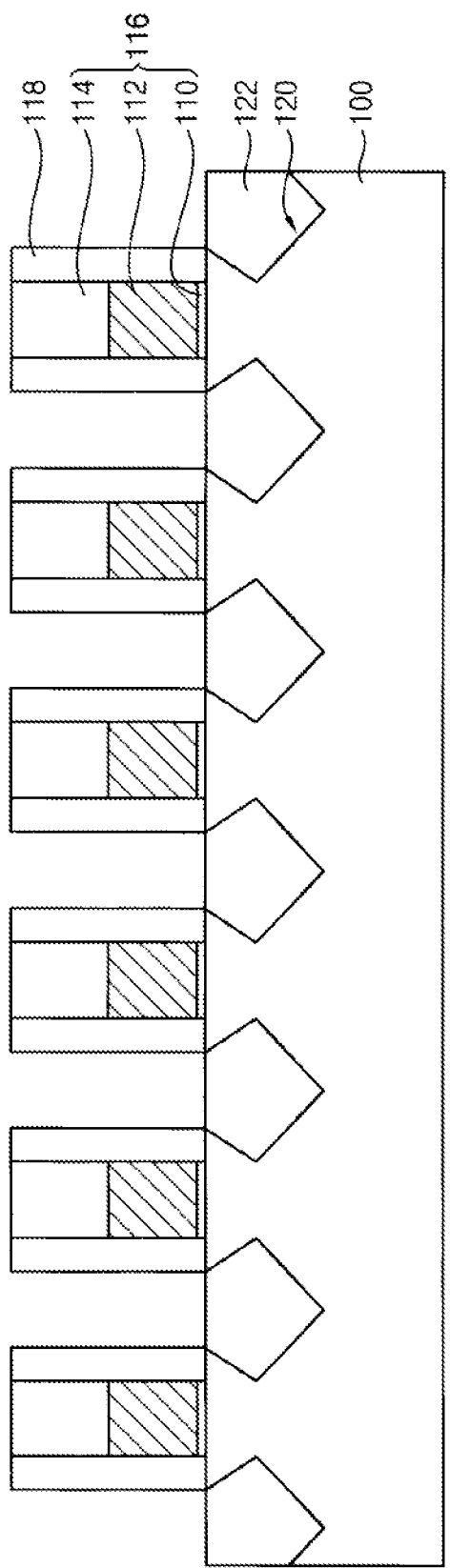

Referring to FIGS. 12 and 13, an upper portion of a substrate 100 may be partially etched to form a trench. An isolation layer 104 may be formed to fill a lower portion of the trench. Before forming the trench, the substrate 100 may be doped with impurities by an ion implantation process to form a well region. In example embodiments, the isolation layer 104 may include, e.g., silicon oxide.

Prior to forming the active fins 102, preliminary active fins extending in the first direction may be formed on the substrate 100 by forming the isolation layer 104. In example embodiments, a plurality of the preliminary active fins may be arranged in the second direction perpendicular to the first direction. The preliminary active fins may protrude from the isolation layer 104.

A dummy gate structure 116 may be formed on the substrate 100. Spacers 118 may be formed on sidewalls of the dummy gate structure 116.

The dummy gate structure 116 may include a dummy gate insulation pattern 110, a dummy gate electrode 112 and a hard mask 114, each of which may be sequentially stacked. In example embodiments, a dummy gate insulation pattern 110 may be formed of oxide, e.g., silicon oxide. A dummy gate electrode layer 112 may be formed of, e.g., polysilicon. The hard mask 114 may be formed of nitride, e.g., silicon nitride.

In example embodiments, the dummy gate structure 116 may be formed on the preliminary active fins and isolation layer 104, and may extend in the second direction. A plurality of dummy gate electrodes 116 may be spaced apart from each other in the first direction.

A spacer layer may be formed on the dummy gate structures 116, the isolation layer 104 and the preliminary active fins. The spacer layer may be anisotropically etched to form spacers 118 on the sidewalls of the dummy gate structures 116.

The preliminary active fin may be partially etched using the dummy gate structures 116 and the spacers 118 as an etching mask to form an active fin 102 including a recess 120. In example embodiments, the spacers 118 and the recess 120 may be formed using an in-situ etching process.

An epitaxial structure 122 may be formed by a selective epitaxial growth (SEG) process using an upper surface of the active fin 102 exposed by the recess 120 as a seed. The epitaxial structure 122 may be formed by an epitaxial growth in a horizontal direction and a vertical direction. In example embodiments, the epitaxial structure 122 may extend in the second direction.

In example embodiments, during the SEG process, the epitaxial structure 122 may be doped with impurities in-situ. Thus, the epitaxial structure 122 may serve as source/drain regions of a FinFET.

In example embodiments, the epitaxial structure 122 may be formed to include, e.g., silicon germanium or silicon. When the semiconductor is a p-type FinFET, the epitaxial structure 122 may include the silicon germanium. When the semiconductor is an n-type FinFET, the epitaxial structure 122 may include the silicon.

In example embodiments, after forming the epitaxial structure 122, an ion doping process and an anneal process for forming the source/drain regions may be further performed.

Figure 14:
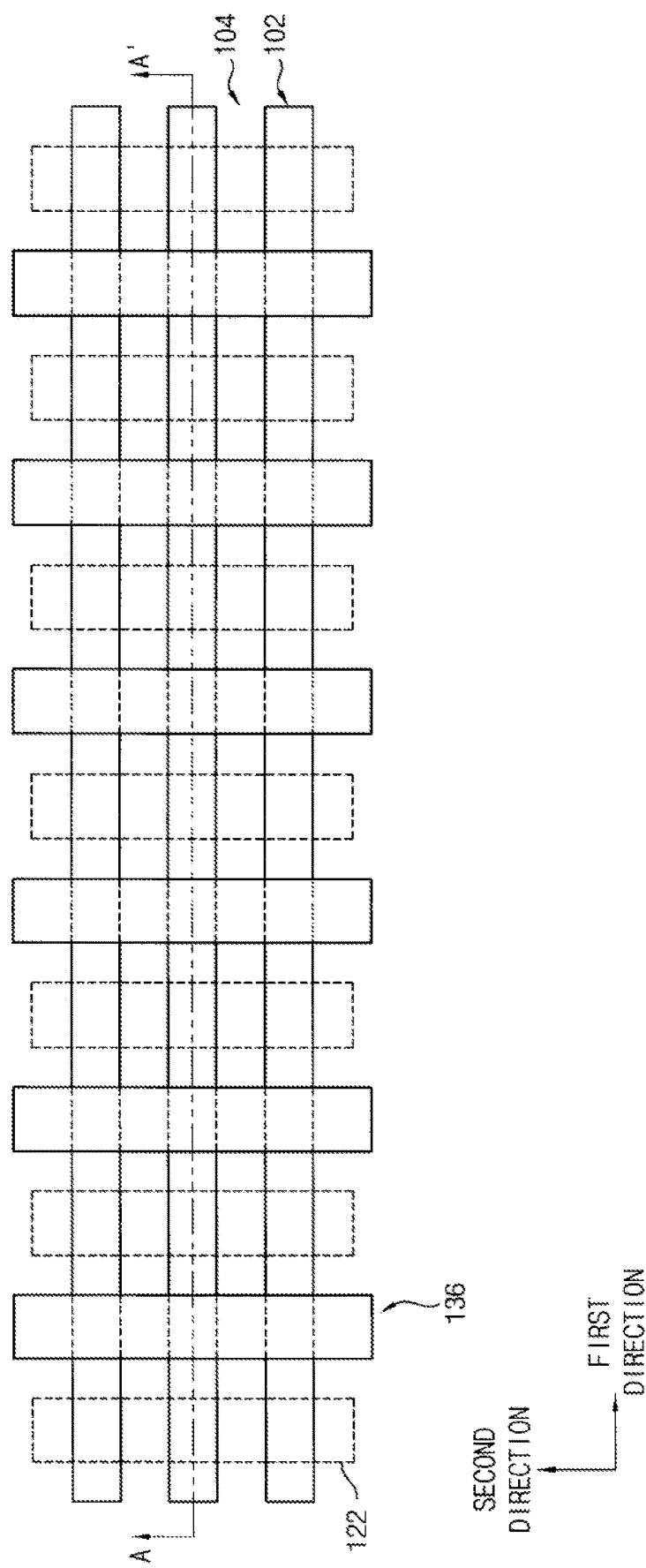
Figure 15:
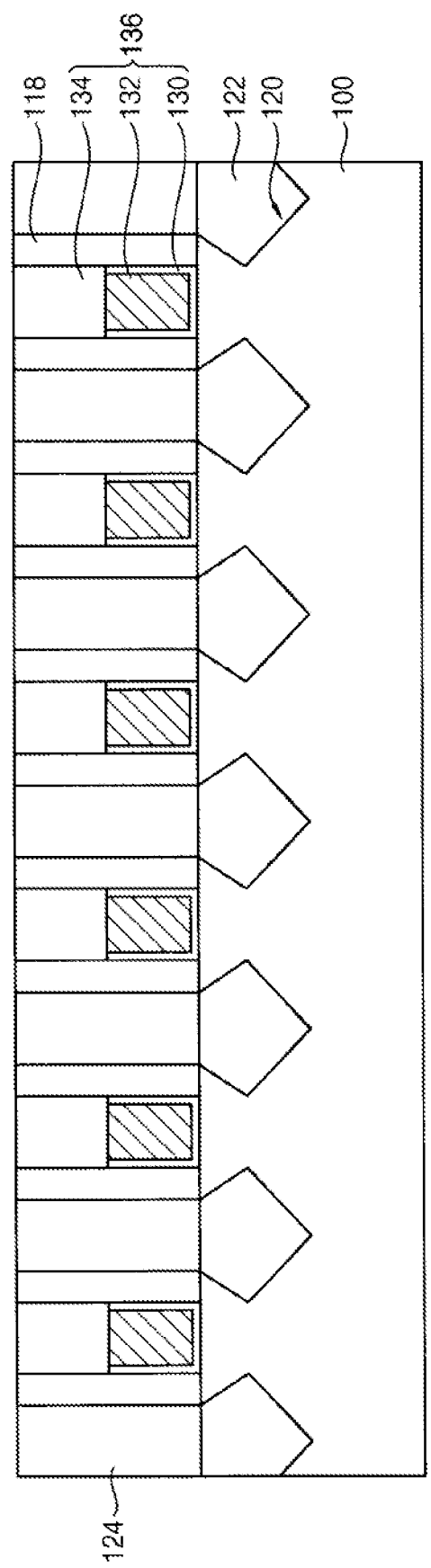

Referring to FIGS. 14 and 15, a lower insulating interlayer 124 may be formed on the dummy gate structures 116 to fill a gap between dummy gate structures 116. The lower insulating interlayer 124 may be planarized until an upper surface of the dummy gate structure 116 may be exposed.

The dummy gate structure 116 may be removed to form an opening. The active fin 102 and the isolation layer 104 may be exposed by the opening. In example embodiments, a thermal oxide layer may be formed on the active fin 102 exposed by the opening.

A gate structure 136 including a gate insulation layer 130, a gate electrode 132 and a capping pattern 134 may be formed in the opening.

In example embodiments, a high dielectric layer may be formed on sidewalls and a bottom surface of the opening and an upper surface of the lower insulating interlayer 124. A gate electrode layer may be formed on the high dielectric layer to sufficiently fill a remaining portion of the opening. The high dielectric layer may be formed of a metal oxide having a high dielectric constant, e.g., hafnium oxide, tantalum oxide, zirconium oxide, or the like. The gate electrode layer may be formed of a metal having a low resistance, e.g., aluminum, copper, tantalum, etc., or a metal nitride thereof.

The gate electrode layer and the high dielectric layer may be planarized until the upper surface of the lower insulating interlayer 124 may be exposed, and an upper portion of the gate electrode layer may be partially etched to form the gate insulation layer 130 and the gate electrode 132. The gate insulation layer 130 may be formed on an inner surface of the opening, and the gate electrode 132 may be formed on the gate insulation layer 130 to fill a lower portion of the opening. In example embodiments, the planarization process may be performed by a chemical mechanical polishing (CMP) process and/or an etch back process. A capping layer may be formed on the gate electrode 132 and the lower insulating interlayer 124. The capping layer may be planarized until the upper surface of the lower insulating interlayer 124 may be exposed to form the capping pattern 134.

Thus, the gate structure 136 including the gate insulation layer 130, the gate electrode 132 and the capping pattern 134 may be formed on the substrate 100.

Figure 16:
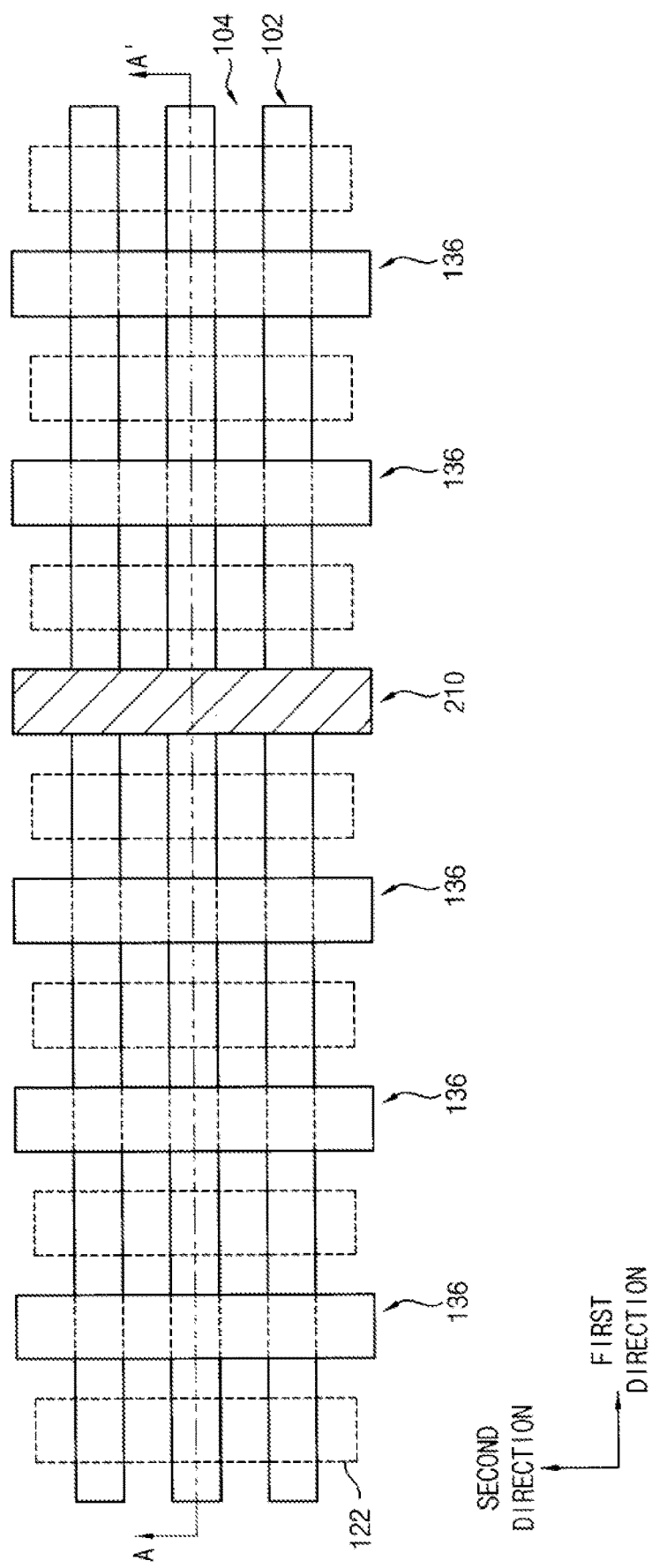
Figure 17:
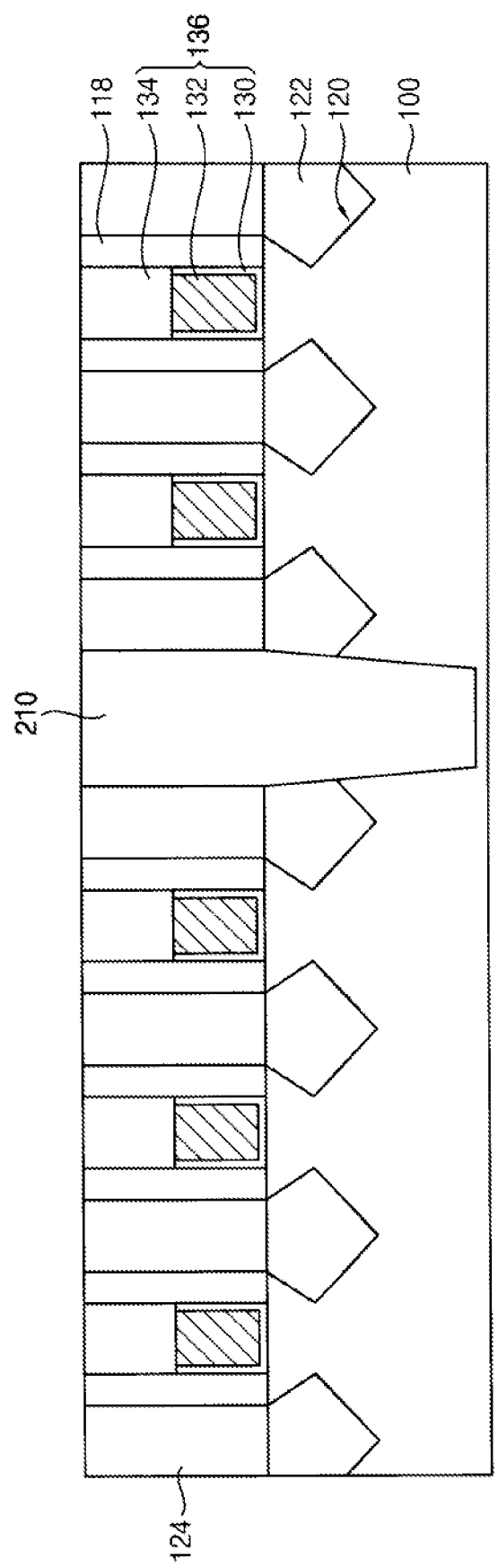

Referring to FIGS. 16 and 17, the gate structure 136 corresponding to a region of a diffusion break pattern may be selectively etched, and the active fin 102 and the isolation layer 104 under the gate structure 136 may be sequentially etched. Thus, a trench extending in the second direction may be formed by the etching process. Also, one or more active fins 102 may be cut by the etching process, so that two active fins 102 may be formed to be spaced apart from each other in the first direction.

An insulation layer may be formed on the lower insulating interlayer 124 to fill the trench. The insulation layer may be planarized until an upper surface of the lower insulating interlayer 124 is exposed to form the diffusion break pattern 210. The diffusion break pattern 210 may include silicon nitride.

In example embodiments, the diffusion break pattern 210 may be a single diffusion break pattern. In this case, one of the gate structures 136 may be etched to form the trench, and the single diffusion break pattern 210 may be formed to fill the trench. Thus, the diffusion break pattern 210 may have a width in the first direction substantially the same as a width in the first direction of the gate structure 136.

In some example embodiments, the diffusion break pattern may be a double diffusion break pattern. In this case, neighboring two gate structures 136 and the lower insulating interlayer 124 between the two gate structures 136 may be etched to form the trench, and the double diffusion break pattern may be formed to fill the trench. Thus, a width in the first direction of the diffusion break pattern 210 may be substantially the same as sum of widths in the first direction of the two gate structures 136 and a gap between the two gate structures 136.

Figure 18:
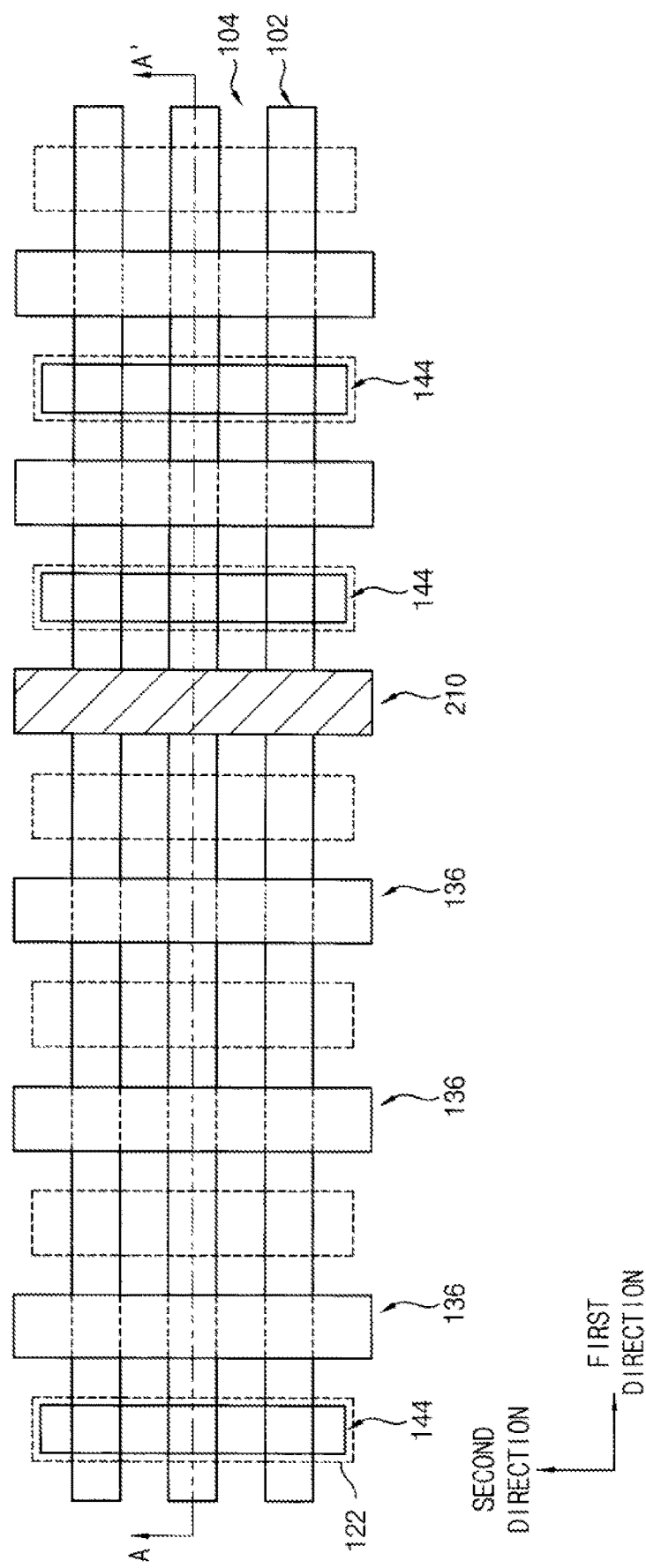
Figure 19:
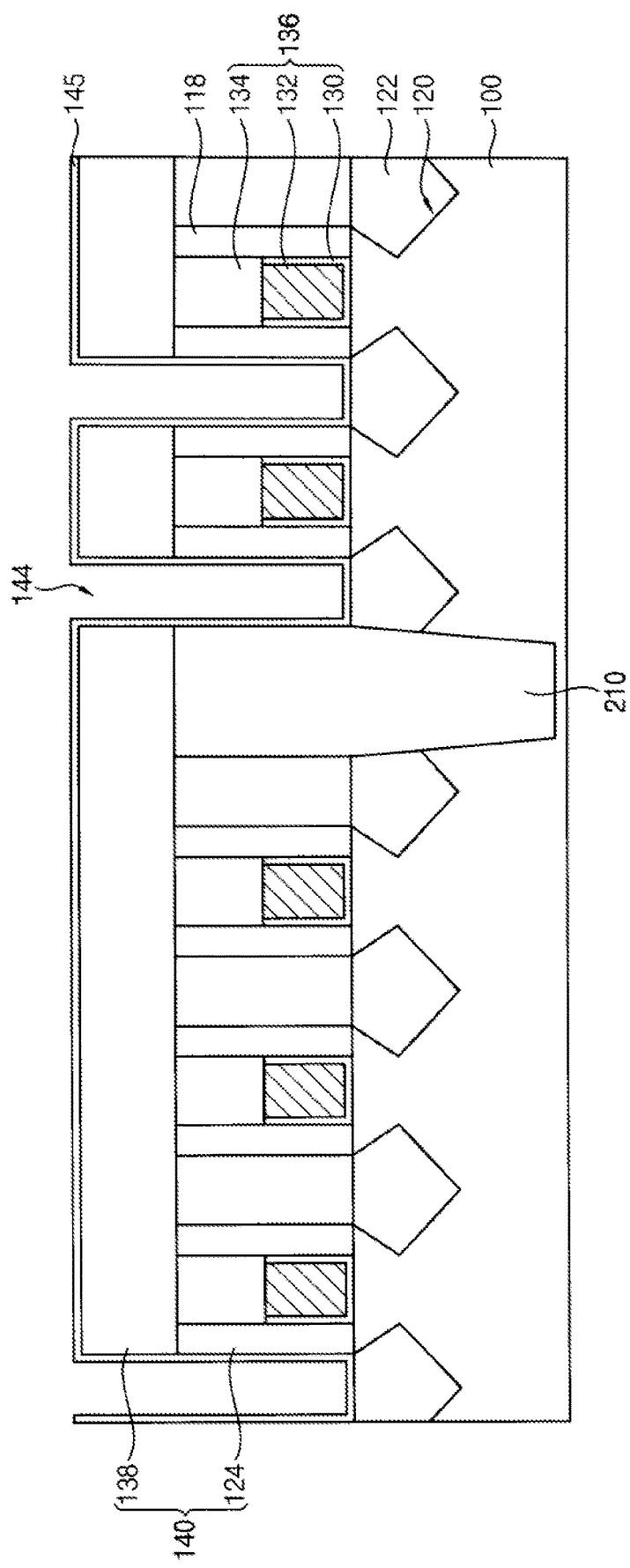

Referring to FIGS. 18 and 19, the upper insulating interlayer 138 may be formed on the lower insulating interlayer 124, the gate structure 136 and the diffusion break pattern 210. The lower insulating interlayer 124 and the upper insulating interlayer 138 may be merged with each other, and the merged lower insulating interlayer 124 and the upper insulating interlayer 138 may be referred to as the first insulating interlayer 140.

In some example embodiments, before forming the upper insulating interlayer 138, an etch stop layer may be formed on the lower insulating interlayer 124. In this case, the etch stop layer may be formed between the lower insulating interlayer 124 and the upper insulating interlayer 138.

In some embodiments, a first etching mask may be formed on the first insulating interlayer 140. The first etching mask may serve as a mask for forming a first contact plug. Thus, the first etching mask may include an opening to be vertically overlapped the epitaxial structure 122 between the gate structures 136. The first insulating interlayer 140 may be etched using the first etching mask to form a first contact hole 144. Thus, a surface of the epitaxial structure 122 may be exposed by the first contact hole 144. The first etching mask may be removed.

In example embodiments, an insulation liner layer 145 may be formed on surfaces of the first contact hole 144 and the first insulating interlayer 140. The insulation liner layer 145 may include, e.g., silicon nitride, silicon oxide. In some example embodiments, the insulation liner layer 145 may not be present.

Figure 20:
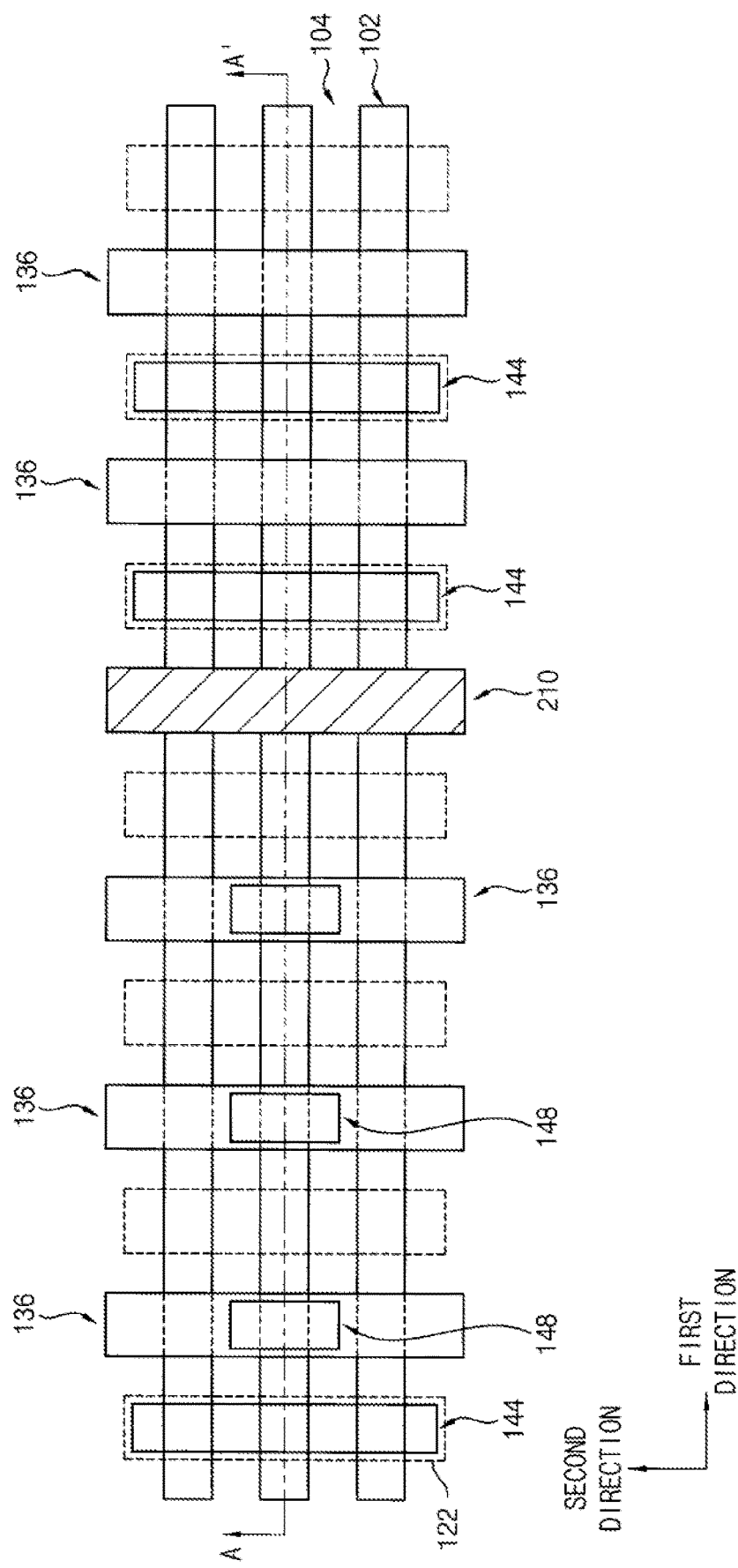
Figure 21:
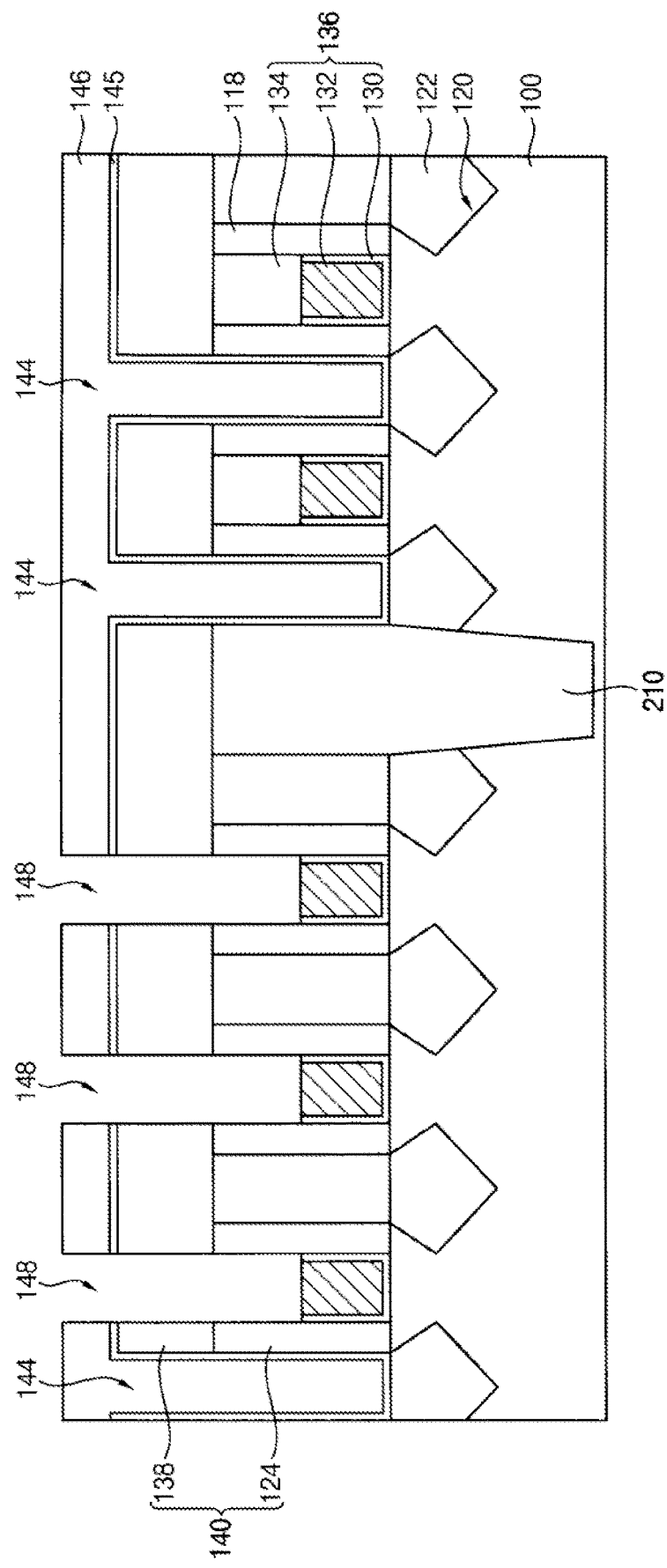

Referring to FIGS. 20 and 21, a second etching mask 146 may be formed on the first insulating interlayer 140. The second etching mask 146 may serve as a mask for forming a second contact plug. Thus, the second etching mask 146 may include an opening to be vertically overlapped the gate structure 136. The first insulating interlayer 140 and the capping pattern 134 may be etched using the second etching mask 146 to form a second contact hole 148. Thus, an upper surface of the gate electrode 132 may be exposed by the second contact hole 148.

The second etching mask 146 may be removed. Thus, the first and second contact holes 144 and 148 may be formed through the first insulating interlayer 140.

Figure 22:
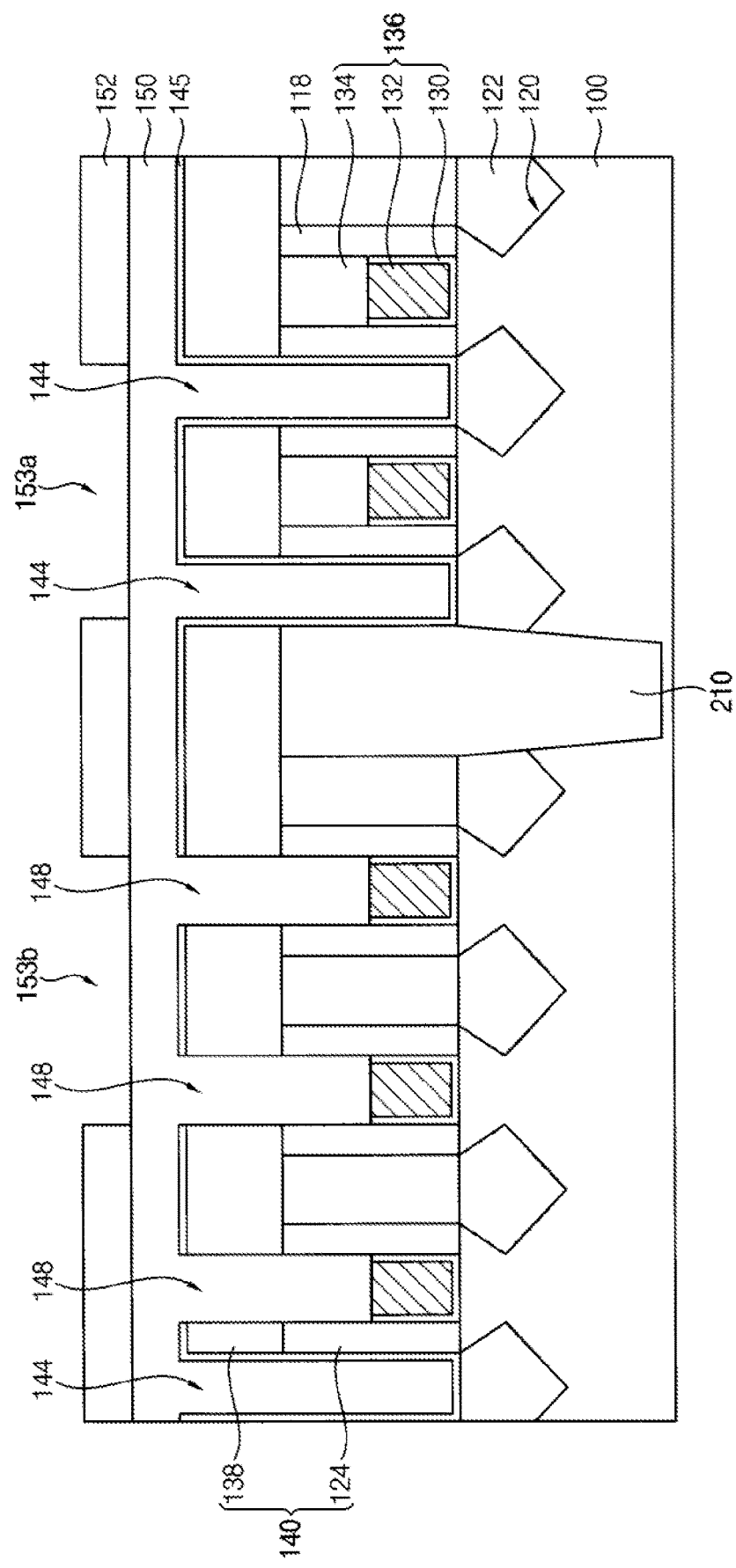

Referring to FIG. 22, a first sacrificial layer 150 may be formed on the first insulating interlayer 140 to fill the first and second contact holes 144 and 148. The first sacrificial layer 150 may include, e.g., spin on hard (SOH) mask including amorphous carbon.

A third etching mask 152 may be formed on the first sacrificial layer 150. The third etching mask 152 may serve as a mask for forming a first connecting pattern and a second connecting pattern. Thus, the third etching mask 152 may include an opening to expose an upper portion corresponding to each of the first and second connecting patterns.

In example embodiments, the opening of the third etching mask 152 may be vertically overlapped with a portion between two contact holes selected from the first and second contact holes 144 and 148. For example, the third etching mask 152 may include a first opening 153a vertically overlapped with a portion between the first contact holes 144. For example, the third etching mask 152 may include a second opening 153b vertically overlapped with a portion between the second contact holes 148. For example, the third etching mask 152 may include an opening vertically overlapped with a portion between the first and second contact holes 144 and 148.

In example embodiments, the third etching mask 152 may include a third opening, which may be in contact with an opening between two contact holes selected from the first and second contact holes 144 and 148. The third opening may extend in a direction different from an extending direction of the opening.

Figure 23:
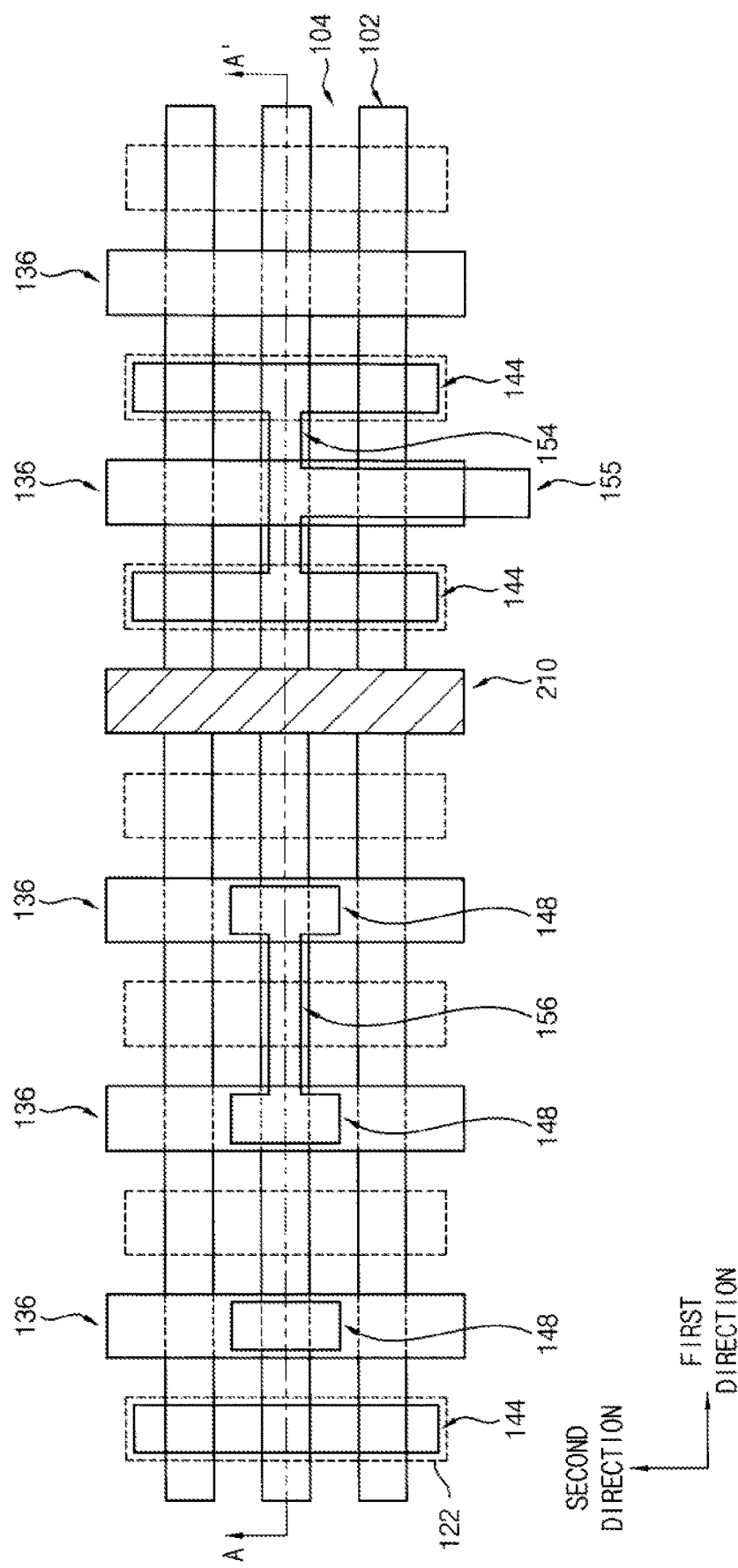
Figure 24:
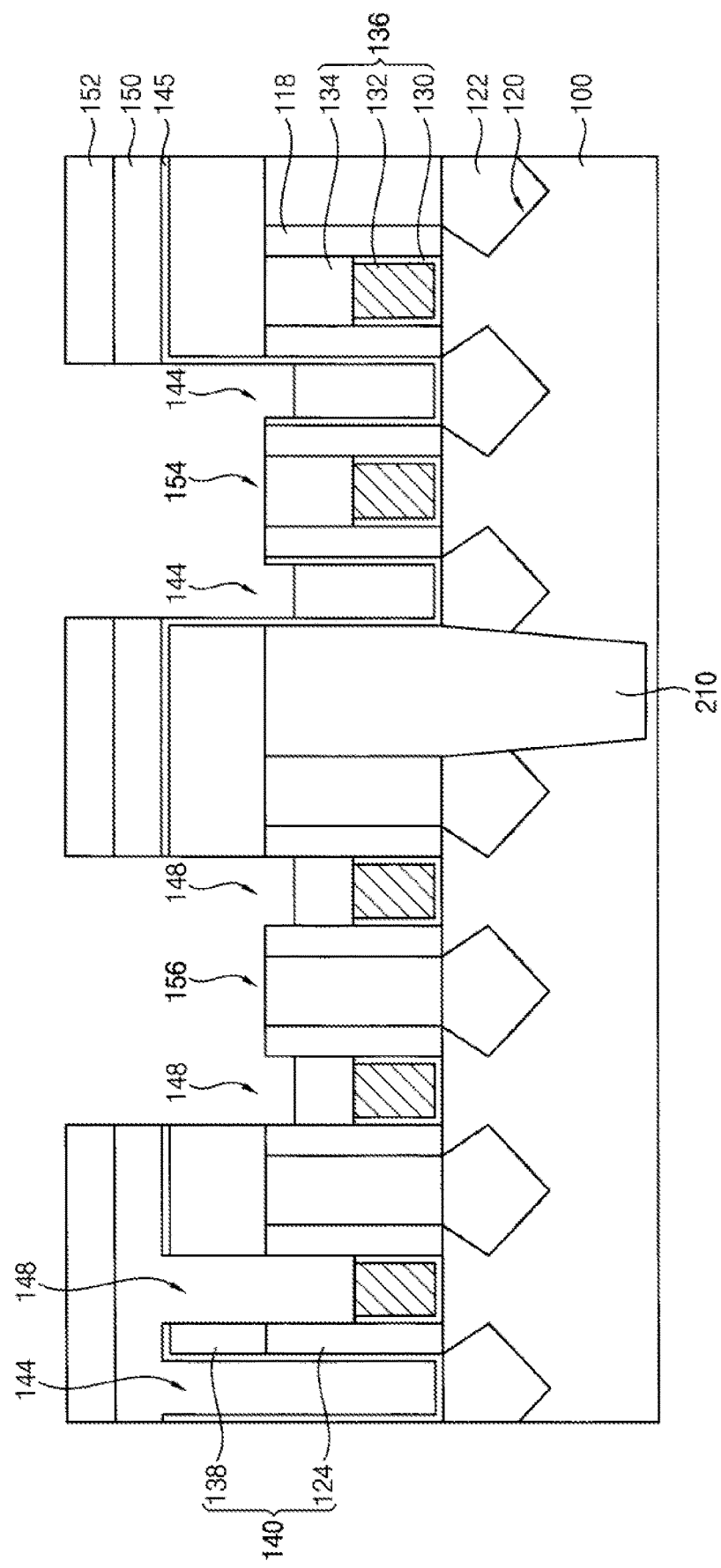

Referring to FIGS. 23 and 24, the first sacrificial layer 150 and the first insulating interlayer 140 may be etched using the third etching mask 152 as an etching mask to form trenches 154, 155 and 156.

In example embodiments, a bottom surface of each of the trenches 154, 155 and 156 may be higher than an upper surface of the gate electrode 132. Thus, the bottom surface of each of the trenches 154, 155 and 156 may be higher than bottoms of the first and second contact holes 144 and 148.

In example embodiments, a first trench 154 may be formed between the first contact holes 144, and may to be connected with upper sidewalls of the first contact holes 144. In example embodiments, a second trench 156 may be formed between the second contact holes 148 to be in contact with upper sidewalls of the second contact holes 148. The first and second trenches 154 and 156 may be formed to extend in the first direction. The third trench 155 may be further formed to be in contact with the first trench 154, and the third trench 155 may extend in the second direction.

In some example embodiments, a trench may be further formed between the first and the second contact holes 144 and 148 to be in contact with upper sidewalls of the first and second contact holes 144 and 148.

Figure 25:
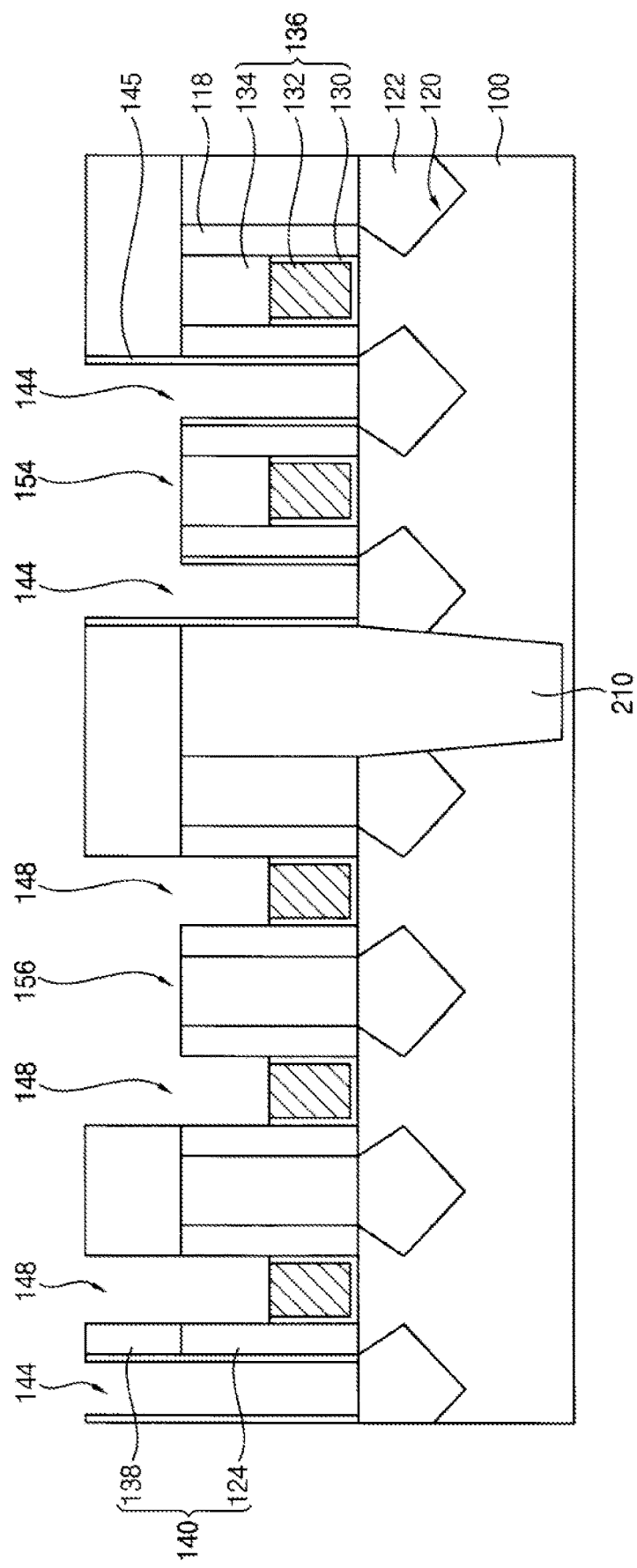

Referring to FIG. 25, the third etching mask 152 and the first sacrificial layer 150 may be removed. In example embodiments, the first sacrificial layer 150 may be removed by an ashing process.

The insulation liner layer 145 formed on a bottom surface of the first contact hole 144 may be removed. Thus, at least a portion of the epitaxial structure 122 may be exposed by the first contact hole 144. In example embodiments, an upper surface of the epitaxial structure 122 may be partially etched by the removing process.

An additional insulation liner layer may be formed on surfaces of the first and second contact holes 144 and 148, the trenches 154, 155 and 156 and the first insulating interlayer 140. The additional insulation liner layer may be anisotropically etched to form an additional insulation liner pattern. The additional insulation liner pattern may include silicon oxide or silicon nitride. In some example embodiments, the additional insulation liner pattern may not be present.

Layouts of the first contact plug, the second contact plug and the second connection pattern may not be limited to the illustrated examples. For example, in the plan view of the semiconductor device, positions of the first contact hole, the second contact hole and the trenches may be changeable. That is, positions of the first and second contact holes and the trench may be changed. Subsequent steps may be performed in the same or similar manner as described above, so that variations on the semiconductor devices shown in FIGS. 4 to 10 may be manufactured.

The first and second contact holes 144 and 148 and the trenches 154, 155, and 156 need not be formed in order as described above. That is, the order of forming the first contact hole 144, the second contact hole 148, and the trenches 154, 155, and 156 may be changeable.

Figure 26:
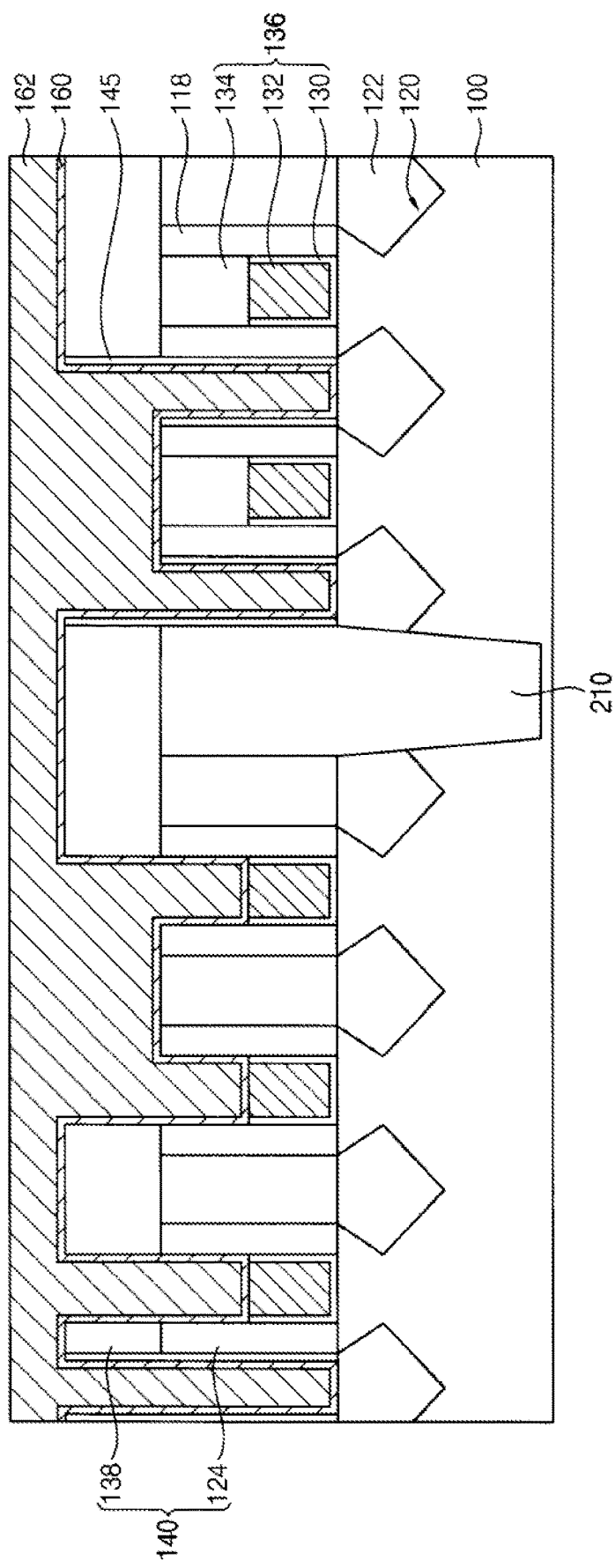

Referring to FIG. 26, a first barrier layer 160 may be formed on the first insulating interlayer 140 and surfaces of the first contact hole 144, the trenches 154, 155 and 156 and the second contact hole 148. The first metal layer 162 may be formed on the first barrier layer 160 to fill the first contact hole 144, the trenches 154, 155 and 156 and the second contact hole 148.

The first barrier layer 160 may be formed of, e.g., titanium, titanium nitride, tantalum, tantalum nitride, etc. The first metal layer 162 may be formed of, e.g., cobalt, aluminum, copper, tungsten, nickel, platinum, gold, silver, etc.

Figure 27:
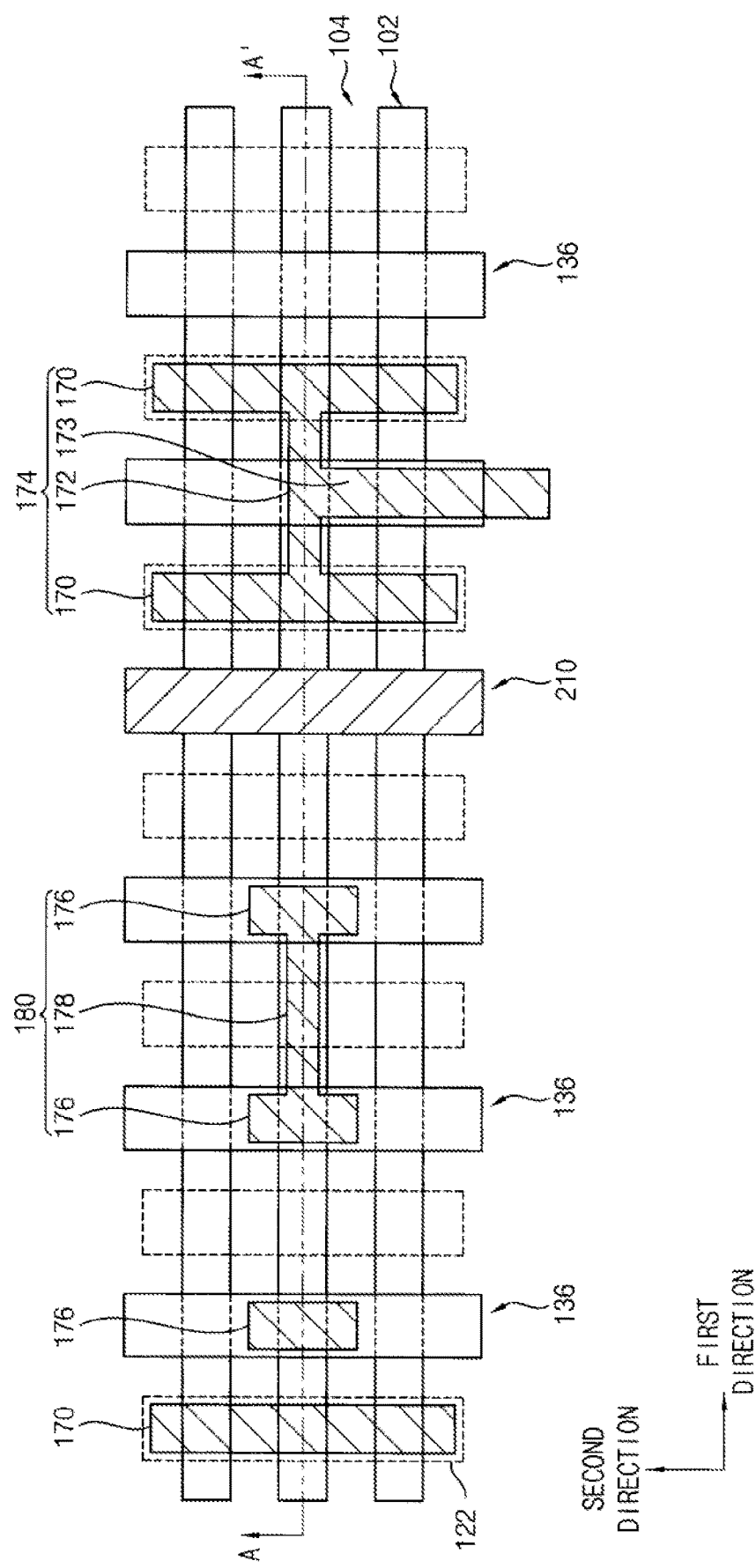
Figure 28:
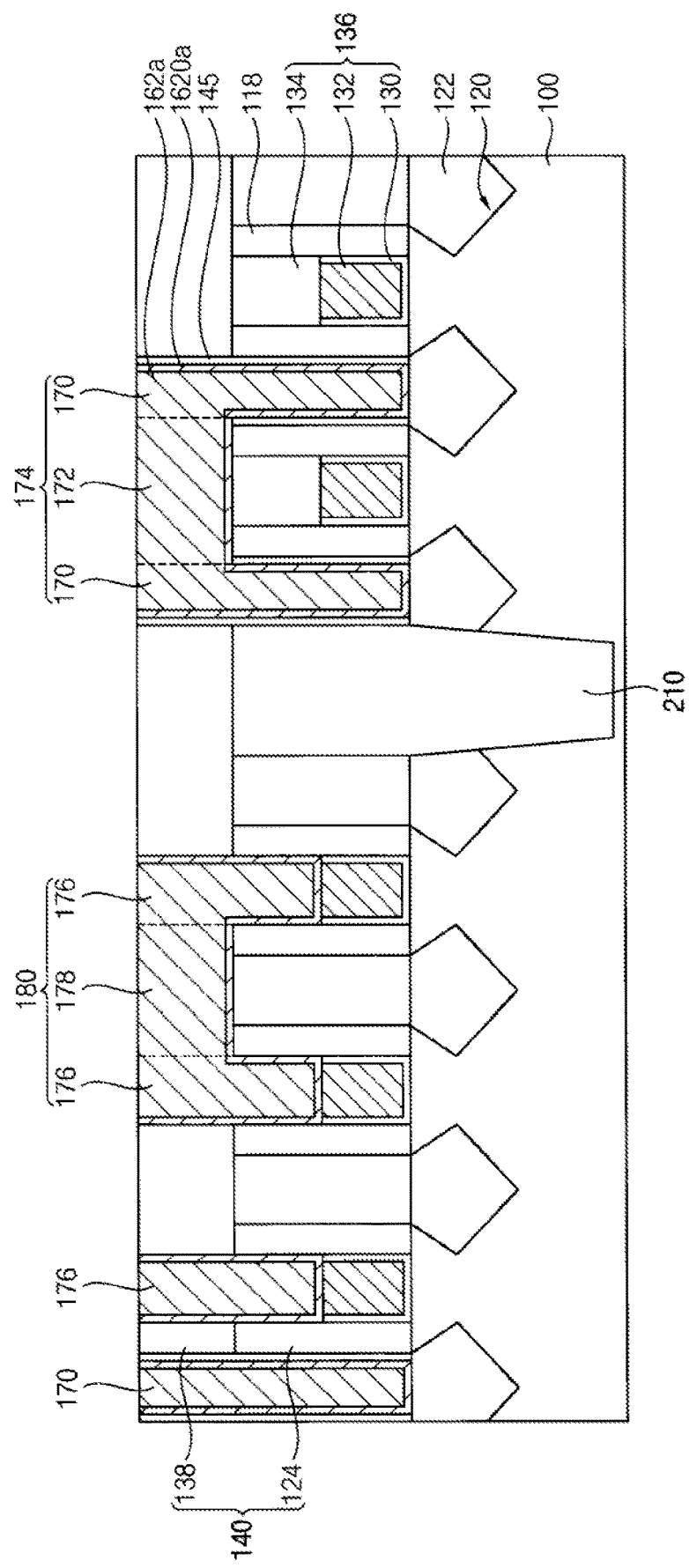

Referring to FIGS. 27 and 28, the first barrier layer 160 and the first metal layer 162 may be planarized until the upper surface of the first insulating interlayer 140 may be exposed. The planarization process may be performed by a CMP process and/or an etch back process. Thus, a first barrier pattern 160a and a first metal pattern 162a may be formed to fill the first contact hole 144, the trenches 154, 155 and 156 and the second contact hole 148.

In example embodiments, a first contact plug 170, a first connecting pattern 172, a second connecting pattern 178, a third connecting pattern 173 and a second contact plug 176 may be formed in the first contact hole 144, the first trench 154, the second trench 156, the third trench 155 and the second contact hole 148, respectively.

As shown in FIGS. 27 and 28, a first structure 174 including two first contact plugs 170, the first connecting pattern 172 and the third connecting pattern 173 may have a single body structure. That is, the first structure 174 may include a first metal pattern 162a having a single body structure and a first barrier pattern 160a surrounding sidewalls and a bottom surface of the first metal pattern 162a. In the first structure 174, a connecting portion between one of the first contact plugs 170 and the first connecting pattern 172 and a connecting portion between the first and the third connecting patterns 172 and 173 may not be separated from each other.

As shown in FIGS. 27 and 28, a second structure 180 including two second contact plugs 176 and the second connecting pattern 178 connected to the two second contact plugs 176 may have a single body structure. That is, the second structure 180 may include the first metal pattern 162a having a single body structure and the first barrier pattern 160a surrounding sidewalls and a bottom surface of the first metal pattern 162a. In the second structure 180, connecting portions of one of second contact plugs 176 and the second connecting pattern 178 may comprise a direct connection with no separation (i.e., the interface may have a thickness or measure that is substantially zero).

Some of the first and second contact plugs 170 and 176 may not be connected to a connecting pattern. First and second contact plugs 170 and 176 that are not connected to connecting pattern may still include a first metal pattern 162a and a first barrier pattern 160a surrounding the sidewalls and bottom surface of the first metal pattern 162a.

In some examples, the first contact plug 170, the first connecting pattern 172, the second connecting pattern 178, the third connecting pattern 173 and the second contact plug 176 may be formed by the same deposition process and planarization process. Thus, the first contact plug 170, the first to third connecting patterns 172, 178 and 173 and the second contact plug 176 may be formed with the same metal used in the first metal pattern 162a and the same barrier metal included in the first barrier pattern 160a.

Upper surfaces of the first contact plug 170, the first connecting pattern 172, the second connecting pattern 178, the third connecting pattern 173 and the second contact plug 176 may be substantially coplanar with each other. That is, heights of the upper surfaces of the first contact plug 170, the first to third connecting patterns 172, 178 and 173 and the second contact plug 176 may be substantially the same.

Figure 29:
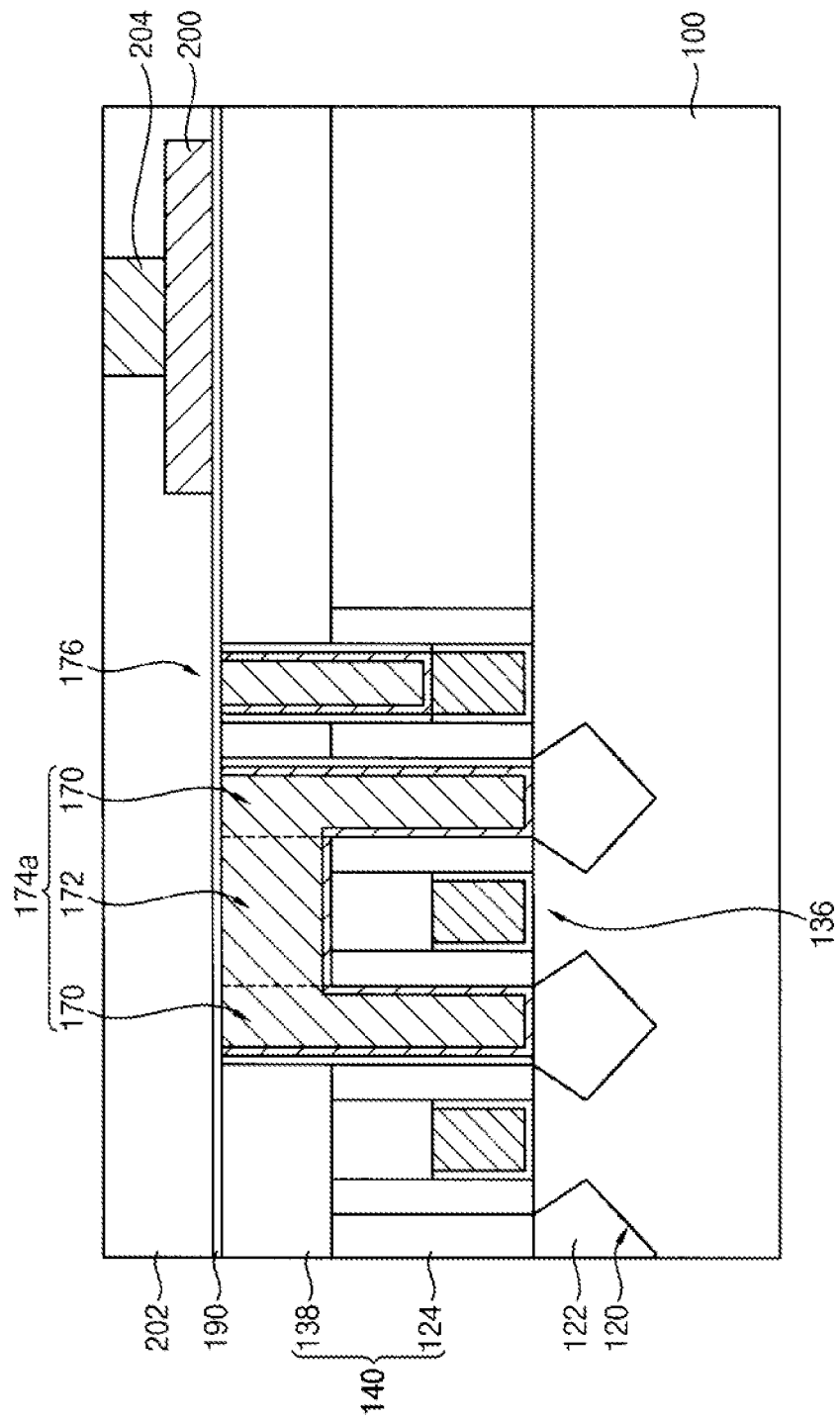
FIG. 29 is a cross-sectional view illustrating a semiconductor device in accordance with example embodiments.

FIG. 29 is a cross-sectional view illustrating a semiconductor device in accordance with example embodiments.

The semiconductor device shown in FIG. 29 may be substantially the same as that illustrated with reference to FIGS. 1A, 2A and 3, except for a resistor pattern.

Referring to FIG. 29, a capping insulation layer 190 may be formed on the first insulating interlayer 140. The resistor pattern 200 may be formed on the capping insulation layer 190.

In some cases, the resistor pattern 200 does not vertically overlap the first contact plug 170, the first connecting pattern 172, the third connecting pattern and the second contact plug 176. In other words, the resistor pattern 200 may be positioned so that it is not located above the first contact plug 170, the first connecting pattern 172, the third connecting pattern and the second contact plug 176. In example embodiments, the resistor pattern 200 does not vertically overlap the gate structure 136. The resistor pattern 200 may include a metal having a target resistance. In example embodiments, the resistor pattern 200 may include a metal having a resistance higher than a resistance of the metal included in the first contact plug 170, the first connecting pattern 172, the third connecting pattern and the second contact plug 176.

A second insulating interlayer 202 may be formed on the capping insulation layer 190 and the resistor pattern 200 to cover the capping insulation layer 190 and at least a portion of the resistor pattern 200.

An upper contact plug 204 may be formed on the resistor pattern 200, and may extend through the second insulating interlayer 202.

Thus, an upper surface of the resistor pattern 200 may not be coplanar with upper surfaces of the first contact plug 170, the first connecting pattern 172, the third connecting pattern, the second contact plug 176 and the first insulating interlayer 140.

Hereinafter, a method of manufacturing the semiconductor device including the resistor pattern may be simply described.

The first insulating interlayer 140, the first contact plug 170, the first connecting pattern 172, the third connecting pattern and the second contact plug 176 may be formed on the substrate 100. A capping insulation layer 190 may be formed on the first insulating interlayer 140, and the resistor layer may be formed on the capping insulation layer 190. The resistor layer may be patterned to form a resistor pattern 200. A second insulating interlayer 202 may be formed to cover the capping insulation layer 190 and the resistor pattern 200. An upper contact plug 204 may be formed on the resistor pattern 200 through the second insulating interlayer 202.

The resistor pattern 200 may be used in the semiconductor devices in accordance with example embodiments. For example, one of the semiconductor devices shown in FIGS. 4 to 10 may include the resistor pattern 200.

Figure 30:
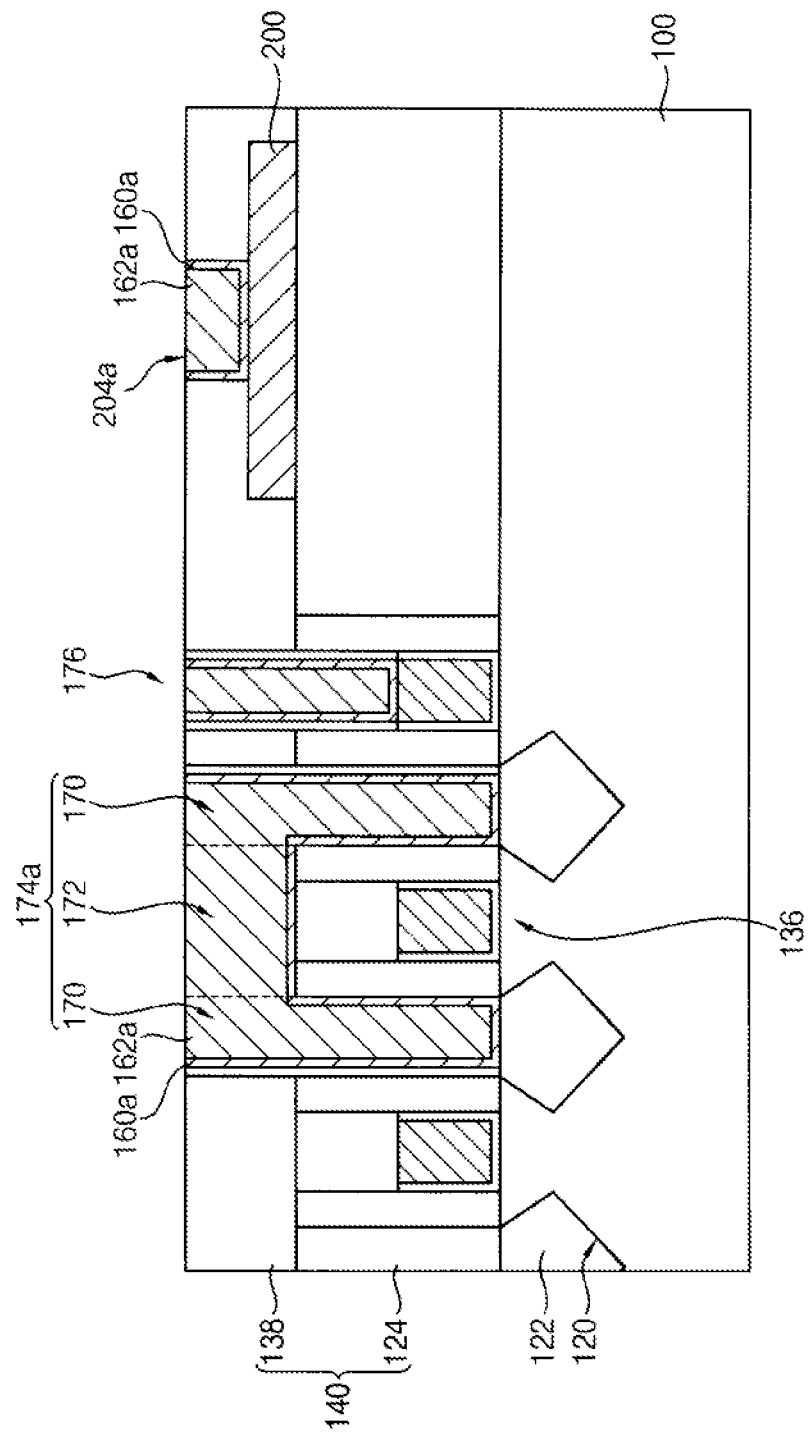
FIG. 30 is a cross-sectional view illustrating a semiconductor device in accordance with example embodiments.

FIG. 30 is a cross-sectional view illustrating a semiconductor device in accordance with example embodiments.

The semiconductor device shown in FIG. 30 may be substantially the same as that illustrated with reference to FIGS. 1A, 2A and 3, except for a resistor pattern.

Referring to FIG. 30, the resistor pattern 200 may be at least partially covered by the first insulating interlayer 140. Specifically, the resistor pattern 200 may be at least partially covered by the upper insulating interlayer 138.

In example embodiments, the resistor pattern 200 may be formed on the lower insulating interlayer 124. Thus, an upper surface of the resistor pattern 200 may be lower than upper surfaces of the first connecting pattern 172, the first contact plug 170, the second contact plug 176 and the first insulating interlayer 140.

A connecting pattern 204a may be electrically connected with the resistor pattern 200. The connecting pattern 204a may include the first metal pattern 162a and the first barrier pattern 160a included in the first connecting pattern 172, the first contact plug 170, the second contact plug 176.

An upper surface of the connecting pattern 204a may be substantially coplanar with the upper surface of the first connecting pattern 172.

A bottom surface of the connecting pattern 204a may contact a surface of the resistor pattern 200. In example embodiments, the connecting pattern 204a may be disposed to cross the resistor pattern 200. In example embodiments, a portion of bottom surface of the connecting pattern 204a may be higher than a bottom surface of the first connecting pattern 172.

In example embodiments, the resistor pattern 200 may be formed so as not to vertically overlap the gate structure 136.

Figure 31:
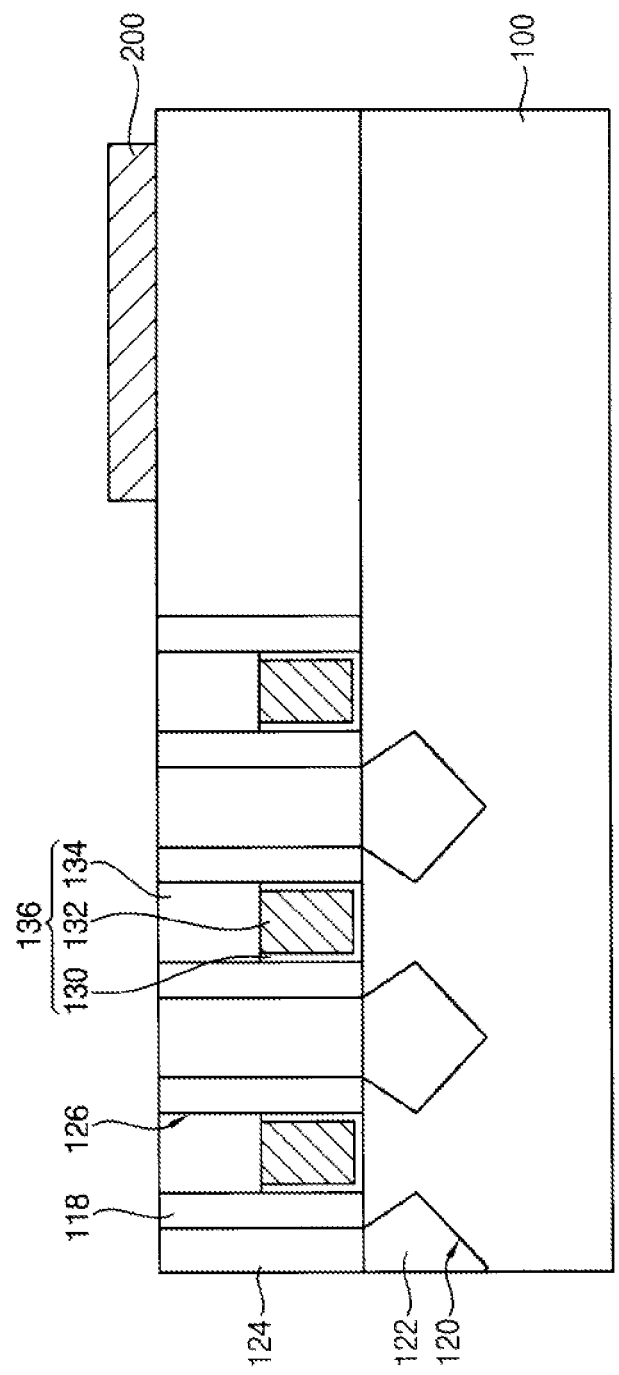

FIGS. 31 and 32 are cross-sectional views illustrating a method of manufacturing a semiconductor device in accordance with example embodiments.

Prior to the steps illustrated by FIGS. 31 and 32, processes substantially the same as or similar to those illustrated with reference to FIGS. 12 to 15 may be performed to form the lower insulating interlayer 124. Also, processes substantially the same as or similar to those illustrated with reference to FIGS. 16 and 17 may be performed to form the diffusion break pattern.

Referring to FIG. 31, a resistor layer may be formed on the lower insulating interlayer 124. The resistor layer may be patterned to form a resistor pattern 200.

Referring to FIG. 32, processes substantially the same as or similar to those illustrated with reference to FIGS. 18 to 25 may be performed. However, in the process illustrated with reference to FIG. 22, the third etching mask 152 may further include an opening 220 exposing an upper portion corresponding to an additional connecting pattern connected with the resistor pattern 200. Thus, the upper portion corresponding to the connecting pattern may be etched together to form an opening 220 in the upper insulating layer 138, during the etching process for forming the first and third connecting patterns 172 and 173.

Processes substantially the same as or similar to those illustrated with reference to FIGS. 26 to 28 may be performed. The first contact plug 170, the first connecting pattern 172, the second contact plug 176 and the additional connecting pattern may be formed by the deposition process of the barrier layer, the deposition process of the metal layer and a planarization process. Thus, the first contact plug 170, the first connecting pattern 172, the second contact plug 176 and the additional connecting pattern may include the same metal included in the first metal pattern 162a and the same barrier metal included in the first barrier pattern 160a. Thus, the semiconductor device shown in FIG. 30 may be manufactured.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

In the present disclosure, the terms 'height', 'higher' and 'lower' may refer to a vertical dimension perpendicular to the surface of the substrate on which the wirings are located. Thus, the term 'higher' may refer to being further from the substrate, and 'lower' may refer to being closer to the substrate (or below the upper surface of the substrate).

The term 'active pattern' may refer to a pattern of active components that carry electrical signals. An active pattern may be contrasted with passive components, such as a substrate, that serve structural or protective functions but do not transmit electrical signals.

What is claimed is:

1. A method of manufacturing a semiconductor device, comprising:
    forming a plurality of gate structures on a substrate, each of the gate structures including a gate insulation layer, a gate electrode and a capping pattern;
    forming a first insulating interlayer covering the plurality of gate structures on the substrate;
    forming a plurality of first contact holes extending through the first insulating interlayer, each of the first contact holes exposing the substrate adjacent to one of the plurality of gate structures;
    forming a plurality of second contact holes extending through the first insulating interlayer, each of the second contact plugs exposing the gate electrode of one of the plurality of gate structures;
    forming a sacrificial layer filling the first contact holes and the second contact holes on the first insulating interlayer;
    partially etching upper portions of the sacrificial layer and the first insulating interlayer to form a first trench, the first trench being in contact with at least one of the first contact holes and the second contact holes;
    removing the sacrificial layer;
    filling the first contact holes, the second contact holes, and the first trench with a conductive material; and
    removing a portion of the conductive material until an upper surface of the first insulating interlayer is exposed to form first contact plugs in the first contact holes, second contact plugs in the second contact holes, and first connection pattern in the first trench.

2. The method of claim 1, wherein a lower surface of the first trench is higher than lower surfaces of the first and second contact holes.

3. The method of claim 1, wherein the first trench is in contact with sidewalls of at least two contact holes selected from the first and second contact holes.

4. The method of claim 1, further comprising:
    forming a second trench being in contact with a sidewall of the first trench, the second trench extending in a direction different from an extension direction of the first trench; and
    forming a second connection pattern in the second trench.

5. The method of claim 4, wherein the first trench is one of a plurality of first trenches, and the second trench is in contact with sidewalls of at least two first trenches.

6. The method of claim 1, wherein the sacrificial layer includes amorphous carbon.

7. The method of claim 1, further comprising forming an insulation liner on sidewalls of the first and second contact holes.

8. The method of claim 1, wherein filling the first contact holes, the second contact holes, and the first trench with a conductive material comprises:
    forming a barrier metal layer on surfaces of the first contact holes, the second contact holes, the first trench and the first insulating interlayer; and
    forming a metal layer filling the first contact holes, the second contact holes, and the first trench on the barrier metal layer.

9. The method of claim 8, wherein the metal layer includes cobalt, aluminum, copper, tungsten, nickel, platinum, gold or silver.

10. The method of claim 1, further comprising etching a portion of the substrate to form an active fin protruding from the substrate and extending in a first direction.

11. The method of claim 10, wherein the plurality of gate structures extend in a second direction crossing the first direction.

12. A method of manufacturing a semiconductor device, comprising:
    etching a portion of a substrate to form an active fin protruding from the substrate and extending in a first direction;
    forming a plurality of gate structures on the active fin, each of gate structures extending in a second direction crossing the first direction, and including a gate insulation layer, a gate electrode and a capping pattern;
    forming an epitaxial structure on the active fin between the gate structures;
    forming a first insulating interlayer covering at least a portion of the gate structures and the epitaxial structure;

forming a plurality of first contact holes extending through the first insulating interlayer, each of the first contact holes exposing the epitaxial structure;

a plurality of second contact holes extending through the first insulating interlayer, each of the second contact holes exposing the gate electrode of one of the plurality of gate structures;

forming a sacrificial layer filling the first contact holes and the second contact holes on the first insulating interlayer;

partially etching upper portions of the sacrificial layer and the first insulating interlayer to form a first trench, the first trench being in contact with at least one of the first contact holes and the second contact holes;

removing the sacrificial layer;

filling the first contact holes, the second contact holes, and the first trench with a conductive material; and removing a portion of the conductive material until an upper surface of the first insulating interlayer is exposed to form first contact plugs in the first contact holes, second contact plugs in the second contact holes, and first connection pattern in the first trench.

13. The method of claim 12, wherein a lower surface of the first trench is higher than lower surfaces of the first and second contact holes.

14. The method of claim 12, wherein the first trench is in contact with sidewalls of at least two contact holes selected from the first and second contact holes.

15. The method of claim 12, further comprising:

forming a second trench being in contact with a sidewall of the first trench, the second trench extending in a direction different from an extension direction of the first trench; and forming a second connection pattern in the second trench.

16. The method of claim 12, wherein filling the first contact holes, the second contact holes, and the first trench with a conductive material comprises:

forming a barrier metal layer on surfaces of the first contact holes, the second contact holes, the first trench and the first insulating interlayer; and forming a metal layer filling the first contact holes, the second contact holes, and the first trench on the barrier metal layer.

17. The method of claim 12, wherein the first insulating interlayer includes a lower insulating interlayer, an etch stop layer and an upper insulating interlayer, and wherein the etch stop layer is exposed by a bottom of the first trench.

18. A method of manufacturing a semiconductor device, comprising:

forming a substrate including first contact regions and second contact regions, wherein the second contact regions have surface heights different from surface heights of the first contact regions;

forming an insulating interlayer on the substrate;

forming a plurality of first contact holes through the insulating interlayer, each of the first contact holes extending through an upper surface of the insulating interlayer to the first contact regions;

a plurality of second contact plugs through the insulating interlayer, each of the second contact plugs extending from the upper surface of the insulating interlayer to the second contact regions; and partially etching upper portions of the first insulating interlayer to form a first trench, the first trench being in contact with at least one of the first contact holes and the second contact holes; and filling the first contact holes, the second contact holes, and the first trench with a conductive material to form first contact plugs in the first contact holes, second contact plugs in the second contact holes, and first connection pattern in the first trench, wherein upper surfaces of the first connection pattern, the first and second contact plugs and the insulating interlayer are substantially coplanar with each other.

19. The method of claim 18, wherein a lower surface of the first trench is higher than lower surfaces of the first and second contact holes.

20. The method of claim 18, the first trench is in contact with sidewalls of at least two contact holes selected from the first and second contact holes.

* * * * *